US007932759B2

(12) United States Patent
Abe et al.

(10) Patent No.: US 7,932,759 B2
(45) Date of Patent: Apr. 26, 2011

(54) DLL CIRCUIT AND CONTROL METHOD THEREFOR

(75) Inventors: Tsuneo Abe, Tokyo (JP); Katsuhiro Kitagawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/554,321

(22) Filed: Sep. 4, 2009

(65) Prior Publication Data

US 2010/0060334 A1 Mar. 11, 2010

(30) Foreign Application Priority Data

Sep. 8, 2008 (JP) .................................. 2008-229962
Aug. 19, 2009 (JP) .................................. 2009-190428

(51) Int. Cl.
*H03L 7/06* (2006.01)
(52) U.S. Cl. ....................................... 327/158; 327/149
(58) Field of Classification Search .................. 327/149, 327/158
See application file for complete search history.

(56) References Cited

U.S. PATENT DOCUMENTS

| 6,674,314 | B2 | 1/2004 | Takai |
| 6,703,879 | B2 | 3/2004 | Okuda et al. |
| 6,859,081 | B2 * | 2/2005 | Hong et al. ................... 327/175 |
| 6,963,235 | B2 * | 11/2005 | Lee ............................. 327/158 |
| 7,358,784 | B2 * | 4/2008 | Kim et al. .................... 327/158 |
| 7,688,124 | B2 * | 3/2010 | Choi ............................ 327/158 |
| 7,772,899 | B2 * | 8/2010 | Choi ............................ 327/158 |
| 7,777,542 | B2 * | 8/2010 | Ku .............................. 327/158 |
| 2003/0117194 | A1 * | 6/2003 | Lee ............................. 327/158 |
| 2007/0069781 | A1 * | 3/2007 | Kim et al. .................... 327/158 |
| 2007/0182470 | A1 * | 8/2007 | Heyne ......................... 327/158 |
| 2008/0042705 | A1 * | 2/2008 | Kim et al. .................... 327/158 |
| 2008/0136476 | A1 * | 6/2008 | Ku .............................. 327/158 |
| 2009/0115471 | A1 * | 5/2009 | Choi ............................ 327/149 |
| 2009/0115475 | A1 * | 5/2009 | Oh .............................. 327/158 |
| 2009/0146715 | A1 * | 6/2009 | Jiang ........................... 327/175 |
| 2010/0060334 | A1 * | 3/2010 | Abe et al. ..................... 327/158 |
| 2010/0156488 | A1 * | 6/2010 | Kim et al. .................... 327/158 |
| 2010/0194458 | A1 * | 8/2010 | Oh .............................. 327/158 |
| 2010/0201414 | A1 * | 8/2010 | Oh .............................. 327/158 |
| 2010/0237917 | A1 * | 9/2010 | Monma ....................... 327/158 |

FOREIGN PATENT DOCUMENTS

| JP | 2002-42469 | 2/2002 |
| JP | 2003-91331 | 3/2003 |

* cited by examiner

*Primary Examiner* — Lincoln Donovan
*Assistant Examiner* — Adam D Houston
(74) *Attorney, Agent, or Firm* — Morrison & Foerster LLP

(57) ABSTRACT

A DLL includes a first variable delay circuit that variably delays a first transition of an external signal, a second variable delay circuit that variably delays a second transition of the external signal, a synthesis circuit that synthesizes output signals of the first variable delay circuit and the second variable delay circuit, a duty change detection circuit that changes and detects the duty of an output signal of the synthesis circuit, and delay control circuits that vary the delay of the first variable delay circuit or the second variable delay circuit in accordance with the result of duty detection by the duty change detection circuit.

27 Claims, 19 Drawing Sheets

FIG. 7A
DLL OUTPUT
FIG. 7B
DCC_CLKF_P/N
FIG. 7C
DCC_CLKR_P/N
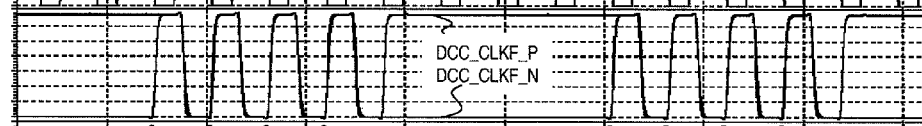
FIG. 7D
DCC_DBR/F
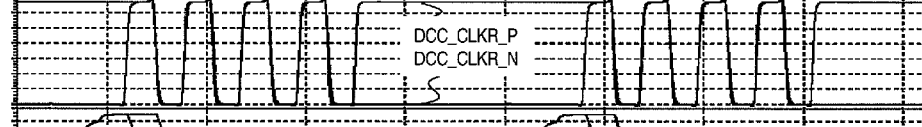
FIG. 7E
DCC_LAT
DCC_PREB
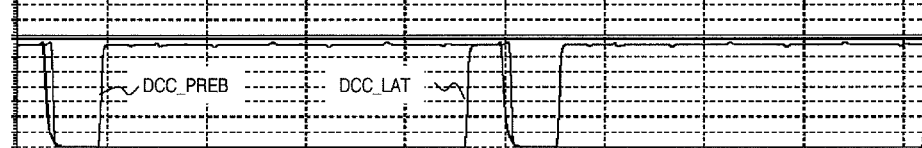

FIG. 15

| APPLICATION | MOSCAP | Pch | | | Nch | | |
|---|---|---|---|---|---|---|---|
| | | Sub | Drain | Source | Sub | Drain | Source |
| NOT APPLY | Cr | H | H | H | L | L | L |
| | Cr1 | L | L | L | H | H | H |
| | Cf | H | H | H | L | L | L |
| | Cf1 | L | L | L | H | H | H |
| APPLIED | Cr | H | H | H | L | L | L |
| | Cr1 | H | H | H | L | L | L |
| | Cf | H | H | H | L | L | L |
| | Cf1 | L | L | L | H | H | H |

POSITION OF FALL EDGE SLIGHTLY ADVANCE

DLL CIRCUIT AND CONTROL METHOD THEREFOR

REFERENCE TO RELATED APPLICATION

This application is based upon and claims the benefits of the priorities of Japanese patent application No. 2008-229962, filed on Sep. 8, 2008 and Japanese patent application No. 2009-190428, filed on Aug. 19, 2009, the disclosure of which is incorporated herein in its entirety by reference thereto.

BACKGROUND OF THE INVENTION

1. Field of the Invention

This invention relates to a DLL (Delay Locked Loop) circuit and a semiconductor device including the same. More particularly, it relates to a DLL circuit capable of performing a fast clocking operation, and a semiconductor device including the same.

2. Description of Related Art

A DLL (Delay Locked Loop) circuit, used as a clock generation circuit in a DRAM (Dynamic Random-Access Memory), variably controls a delay value of an input clock to generate a clock having a desired phase. A DLL circuit, provided with a DCC (Duty Correction Circuit), creates a waveform of an internal signal of, for example, the duty of 50%, without dependency upon the duty of the external clock. The duty, also termed a duty ratio, means the ratio of a HIGH level period with respect to one cycle.

With the increase of the operation frequency, the duty gets collapsed. The adverse effect of duty collapsing may be canceled to some extent by exercising control of delivering a DLL output to a pseudo output circuit (replica), feeding back an output signal of the pseudo output circuit and comparing the phase of the output signal to that of the clock CK. However, the pseudo output circuit (replica) cannot always make the cancellation optimum in light of the properties of interconnects and signals.

Patent Document 1, for example, discloses a configuration in a DLL in which the duty of an input clock is brought into coincidence with the duty of an output clock by providing a clock duty detection and correction circuit (CDC) on a succeeding stage of a variable delay circuit (VDL). In this configuration, the delay value of the variable delay circuit (VDL) is controlled by a rising edge of the clock. The phase of the rising edge is brought into coincidence with that of a reference input clock on a path of the variable delay circuit composed of a replica, a frequency dividing circuit, a PD (Phase Detector), CP1 (Charge Pump) and a bias. When the phase of the clock rising edge has been brought into coincidence with that of the reference input clock, the duty of the output clock is brought into coincidence with the duty of the reference clock by adjusting the pulse width of the output clock by the falling edge on the path of the duty detection and correction circuit (CDC) including the replica, a PFD (Phase Frequency Comparator) and CP2 (Charge Pump). Control is exercised so that the duty of the output clock is moved towards 50% from start of the operation of the DLL circuit until the rising edge of the output clock is phase-locked, and so that the duty of the output clock is caused to be coincident with that of the external clock after the timing the rising edge of the output clock has been locked into coincidence with the external clock. Hence, the duty of the output clock is changed from 50% to the duty of the input clock.

Patent Document 2 also shows a related technique.

[Patent Document 1]

JP Patent Kokai Publication No. JP2002-42469A, corresponding to U.S. Pat. No. 6,703,879 (FIGS. 1 and 14)

[Patent Document 2]

JP Patent Kokai Publication No. JP2003-91331 A, corresponding to U.S. Pat. No. 6,674,3149 (FIG. 1)

The entire disclosers of Patent Documents 1 and 2 are incorporated herein by reference thereto.

SUMMARY

The following is an analysis of the related arts by the present inventor.

The configuration of Patent Document 1 shows a serial system in which the phase of the rising edge of an output clock is locked by a variable delay circuit (VDC) and the duty of the output clock is adjusted by a duty detection and correction circuit provided at a stage succeeding to the VDC. Hence, it takes much time until change to the duty of the input clock (see FIG. 14 of Patent Document 1). The sensitivity of the duty detection and correction circuit (CDC) is also of a problem.

Moreover, since phase lock is via two routes of the variable delay circuit (VDL) and the duty detection and correction circuit (CDC), it becomes necessary to provide supplementary circuits, such as PFD (Phase and Frequency Comparator) and CP2 (Charge Pump), in addition to the PD (Phase Detector) and CP1 (Charge Pump), on a path of the variable delay circuit (VDL). This leads to redundant circuit configuration.

Such a function is desirable that adjust the duty to the original duty value, when the duty shift occurs due to fabrication process variations or the like.

The invention which seeks to solve one or more of the above mentioned problems may be summarized substantially as follows:

According to the present invention, there is provided a DLL circuit including a duty detection circuit and a duty change circuit. The duty detection circuit detects a duty which is a ratio of a HIGH level period and a LOW level period of an output signal of a synthesis circuit that synthesizes a delay signal output from a pair of variable delay circuits in association with first and second transitions of an external signal. The duty change circuit changes the duty of the output signal of the synthesis circuit to a value different from a prescribed duty value. An output of a selection circuit that selects one of the duty detection result by the duty change detection circuit and the phase comparison result by the phase detector (P/D) that compares the output signal of the synthesis circuit and the phase of the external signal is supplied to a delay control circuit that varies the delay of at least one of the first and second variable delay circuits.

In one mode, the present invention provides a DLL controlling method comprising:

receiving an output signal a duty value from a DLL (Delay Locked Loop);

generating a signal obtained by changing which the duty value of the DLL output signal;

comparing the signal having the duty value thereof changed with a reference duty value; and controlling the delay value of the DLL in accordance with the result of the comparison.

There is provided a DLL (delay locked loop) circuit comprising: a first variable delay circuit variably delaying a first transition of an external signal to output a resulting output signal;

a second variable delay circuit variably delaying a second transition of the external signal to output a resulting output signal;

a synthesis circuit receiving the output signal of the first variable delay circuit and the output signal of the second variable delay circuit to synthesize the received signals;

a duty change detection circuit including a duty detection circuit and a duty change circuit, wherein the duty detection circuit includes a capacitor discharged or charged based on an output signal of the synthesis circuit to detect a duty of the output signal of the synthesis circuit using the capacitor, and the duty change circuit changes the duty of the output signal of the synthesis circuit by changing a capacitance value of the capacitor included in the duty detection circuit, the duty being a ratio of a high level period and a low level period relative to one period of the output signal of the synthesis circuit; and a delay control circuit changing at least one of a delay of the first variable delay circuit and a delay of the second variable delay circuit in accordance with the result of duty detection of the duty change detection circuit.

In the present invention, the duty detection circuit includes, as the capacitor for duty detection, a first capacitor being subjected to charging or discharging, when an in-phase signal which is in-phase with the output signal of the synthesis circuit is active to have a terminal voltage thereof set to a voltage corresponding to a time width of an activation period of the in-phase signal; and a second capacitor being subjected to charging or discharging, when a reverse-phase signal whose phase is reversed with respect to the output signal of the synthesis circuit is active to have a terminal voltage thereof set to a voltage corresponding to a time width of an activation period of the in-phase signal, wherein in the duty detection circuit, the terminal voltage of the first capacitor and the terminal voltage of the second capacitor are compared to detect the duty of the output signal of the synthesis circuit, and the duty of the output signal of the synthesis circuit is changed by changing at least one of the capacitance values of the first and second capacitors.

With the present invention, the duty may be changed as redundant paths or circuits are dispensed with, and as the circuit is prevented from increasing in size.

According to the present invention, it is possible to adjust the duty to the original duty value, when the duty shift occurs due to fabrication process variations or the like.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 7A, 7B, 7C, 7D and 7E are timing waveform diagrams for illustrating the operation of a duty detection circuit according to an exemplary embodiment of the present invention.

FIG. 15 shows the relation of the terminal voltages of MOS capacitors.

PREFERRED MODES

Figure 1:
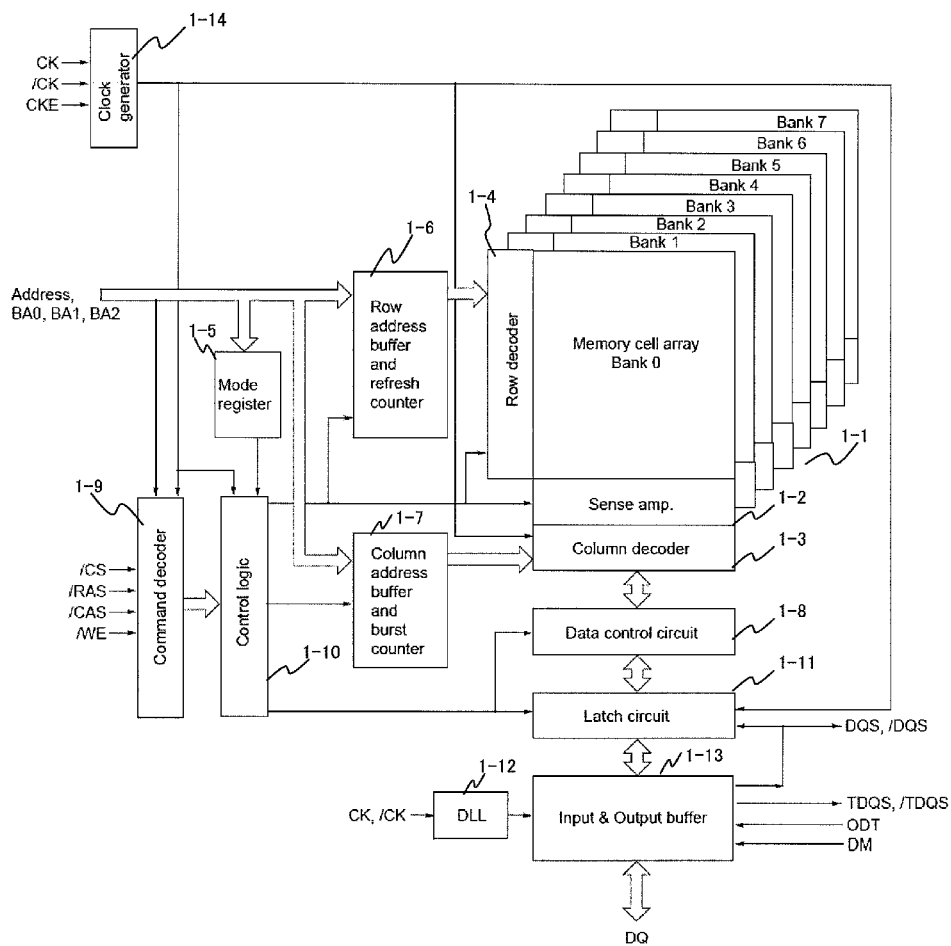
FIG. 1 is a schematic block diagram showing an overall configuration of a memory according to an exemplary embodiment of the present invention.

According to the present invention, an output signal of the DLL circuit of a prescribed duty value is supplied to the duty change circuit to generate a signal which is the output signal of the DLL circuit whose duty value has been changed. The so generated signal is supplied to the duty detection circuit, which duty detection circuit compares the signal, whose duty value has been changed, to the reference duty value. Based on the result of comparison and detection at the duty detection circuit, the delay value of the delay control circuit that controls the delay of the DLL circuit is controlled. According to the present invention, the duty value of the output signal of the DLL is controlled to a value corresponding to the reference duty value plus or minus an offset value (absolute value) of the duty representing the variation. The duty represents the ratio of a HIGH level (HIGH period) and a LOW level (LOW period) as a boundary with a preset reference voltage in one cycle, and is also termed a duty ratio. In short, the duty means a ratio of the HIGH period or the LOW period in one cycle.

In more detail, in its one mode, the present invention provides a DLL circuit comprising a first variable delay circuit (10R), a second variable delay circuit (10F), a synthesis circuit (13), a duty change detection circuit (21) and a delay control circuit (such as 15F). The first variable delay circuit variably delays a first transition (Rise) of an external signal to output a resulting output signal, and the second variable delay circuit (10F) variably delays a second transition (Fall) of the external signal to output a resulting output signal. The synthesis circuit synthesizes the output signal of the first variable delay circuit (10R) and the output signal of the second variable delay circuit (10F). The duty change detection circuit changes and detects the duty of an output signal of the synthesis circuit and the delay control circuit (such as 15F) changes the delay of at least one of the first variable delay circuit and the second variable delay circuit (10R, 10F) in accordance with the result of duty detection (DCC) of the duty change detection circuit (21).

According to the present invention, the duty of the output of the synthesis circuit (13) is changed and detected by the duty change detection circuit (21). Based on the result of duty detection, the delay control circuit (15F) is controlled to generate a desired duty.

In another mode of the present invention, the duty change detection circuit (21) receives a duty control signal that variably controls the duty. The duty change detection circuit generates a signal having a duty changed from a prescribed duty value, such as 50%, in accordance with the duty control signal. The duty change detection circuit compares the signal having a duty value thereof changed, to a reference duty value, and supplies the result of comparison to the delay control circuit. During testing, for example, the duty control signal may be changed to change the duty of an internal signal.

In one mode of the present invention, the output of the synthesis circuit (13) is supplied to the duty change circuit (101) in the duty change detection circuit (21). An output of the duty change circuit (101) is supplied to the duty detection circuit (102). The duty value of an output signal output from the synthesis circuit (13), such as 50%, is changed by the duty change circuit (101) to a pseudo different duty value, such as 45%, which different duty value is supplied to the duty detection circuit (102). The delay control circuit (15F) is caused to operate in accordance with an output signal (DCC) from the data detection circuit (102) that adjusts the duty value to 50%. This configuration renders it possible to dispense with circuit elements for duty change that might otherwise need to be added to the sensitive duty detection circuit (102) and hence renders it possible to improve detection accuracy of the duty detection circuit.

In one mode of the present invention, the duty change circuit (101) includes a controller (103) that controls the rise and fall waveforms of the output of the synthesis circuit. The duty change circuit (101) changes the rise/fall waveforms of the signal supplied thereto to change the prescribed duty value (50%) to an apparently different duty value. According to this configuration of the present invention, it is possible to generate a duty, such as 40%, different from the prescribed duty value, such as 50%, by a simplified circuit configuration.

In one mode of the present invention, there are provided phase detectors (phase comparators) (14R, 14F) and a selection circuit (22) in the DLL circuit. The phase detectors (14R, 14F) detect the phase difference between external signals (CK, CKB) and output signals (RCLK, FCLK) of the replica (20), and the selection circuit (22) selectively switches between the output signal of the duty change detection circuit (21) and the output signals of the phase detectors (14R, 14F).

The output of the selection circuit (22) is supplied to the delay control circuit (15F). According to the present invention, phase adjustment (phase lock) is performed at the first transition (Rise) and duty adjustment is performed at the second transition (Fall). It is thus possible to reduce the circuit size and to accomplish phase lock control and duty control simultaneously.

According to the present invention, a semiconductor device comprises a memory cell array (1-1), a memory control circuit (1-13) having an access circuit that accesses the memory cell array, and a DLL circuit (1-12) that generates a timing clock for an input and/or an output of memory cell data by the memory control circuit. The DLL circuit (1-12) includes a first variable delay circuit (10R), a second variable delay circuit (10F) and a synthesis circuit (13). The first variable delay circuit variably delays a first transition (Rise) of an external signal to output a resulting output signal, and the second variable delay circuit variably delays a second transition (Fall) of the external signal to output a resulting output signal. The synthesis circuit synthesizes the output signal of the first variable delay circuit and the output signal of the second variable delay circuit. The DLL circuit also includes a duty change detection circuit (21) that includes a duty detection circuit (102) which detects a duty of an output signal of the synthesis circuit (13), a duty change circuit (101) that changes the duty of the output signal of the synthesis circuit (13) to a value different from the prescribed duty value, and a delay control circuit (15F) that changes delay of the first variable delay circuit (10R) or the second variable delay circuit (10F) in accordance with the result of duty detection of the duty change detection circuit (21).

According to the present invention, there is provided a method for controlling the operation of a DLL including detecting the duty of a signal of a prescribed duty value output from the DLL and also including controlling the duty of a signal supplied to the DLL delay control circuit in accordance with the result of duty detection. The present invention will now be described with reference to exemplary embodiments.

FIG. 1 shows a global configuration of a DRAM device that includes a DLL according to an exemplary embodiment of the present invention. The DRAM device of FIG. 1 is a DDR (Double Data Rate) SDRAM (Synchronous DRAM) of an eight bank memory configuration. The DDR SDRAM is such an SDRAM that receives/transmits data in synchronization with both rise and fall edges of a clock. Referring to FIG. 1, a row decoder 1-4 decodes a row address to drive a selected word line, not shown. A sense amplifier 1-2 amplifies data read out on a bit line, not shown, of a memory cell array 1-1. During refresh, the sense amplifier 1-2 amplifies data read on a bit line connecting to a cell of a word line selected by a refresh address, and writes the cell data back to the cell. A column decoder 1-3 decodes a column address to turn on a selected Y-switch, not shown, to select a bit line to connect the so selected bit line to an IO line, not shown. A command decoder 1-9 receives a prescribed address signal and, as control signals, a chip select signal /CS, a row address strobe signal /RAS, a column address strobe signal /CAS and a write enable signal /WE to decode a command. A slush mark/of a signal name indicates LOW active. A column address buffer-burst counter 1-7 generates, under control by a control logic 1-10 that receives a control signal from the command decoder 1-9, addresses of a burst length from the input column address, and supplies the so generated addresses to the column decoder 1-3. A mode register 1-5 receives address signals and bank selection signals BA0, BA1, and BA2 to output a control signal to the control logic 1-10. The bank selection signals BA0, BA1, and BA2 select one of the eight banks.

A row address buffer of a row address buffer-refresh counter 1-6 receives an input row address to output it to the row decoder 1-4. Its refresh counter receives a refresh command to perform a count-up operation to output a count value as a refresh address. The row address from the row address buffer and the refresh address from the refresh counter are supplied to a multiplexer, not shown. During refresh, the refresh address is selected and, otherwise, the row address from the row address buffer is selected. The so selected address is supplied to the row decoder 1-4.

The clock generator 1-14 receives complementary external clocks CK and /CK supplied to the DRAM device, and provides an internal clock in case a clock enable signal CKE is HIGH. In case the clock enable signal CKE is LOW, the clock generator 1-14 stops clock supply.

A data control circuit 1-8 performs input and output of write data and read data. A latch circuit 1-11 latches the write data and the read data. An input and output buffer 1-13 performs input and output of data at a data terminal DQ. A DLL 1-12 generates a signal, delay-synchronized with respect to the external clocks CK, /CK, to deliver the so generated clocks to the input and output buffer 1-13. Read data from the memory cell array 1-1 is supplied from the latch circuit 1-11 to the input and output buffer 1-13. The input and output buffer 1-13 outputs the read data from the data terminal DQ at a double data rate, using rise and fall edges of the clock signal synchronized with the external clock CK by the DLL 1-12.

DM is a data mask signal for write data. In write operation, write is written when the signal is HIGH. DQS and /DQS are differential data strobe signals that prescribe the timings of data write and data read. DQS and /DQS are I/O signals, that is, an input signal in a write operation and an output signal in a read operation. TDQS and /TDDQ are differential signals that provide for compatibility of an X8 data configuration with an X4 data configuration. ODT (On-Die Termination) is a control signal that turns terminal resistances of DQ, /DQS, TDQS and /TDQS on or off. FIG. 1 schematically shows a typical example of a DRAM device which, of course, is not intended to restrict the scope of the present invention.

Figure 2:
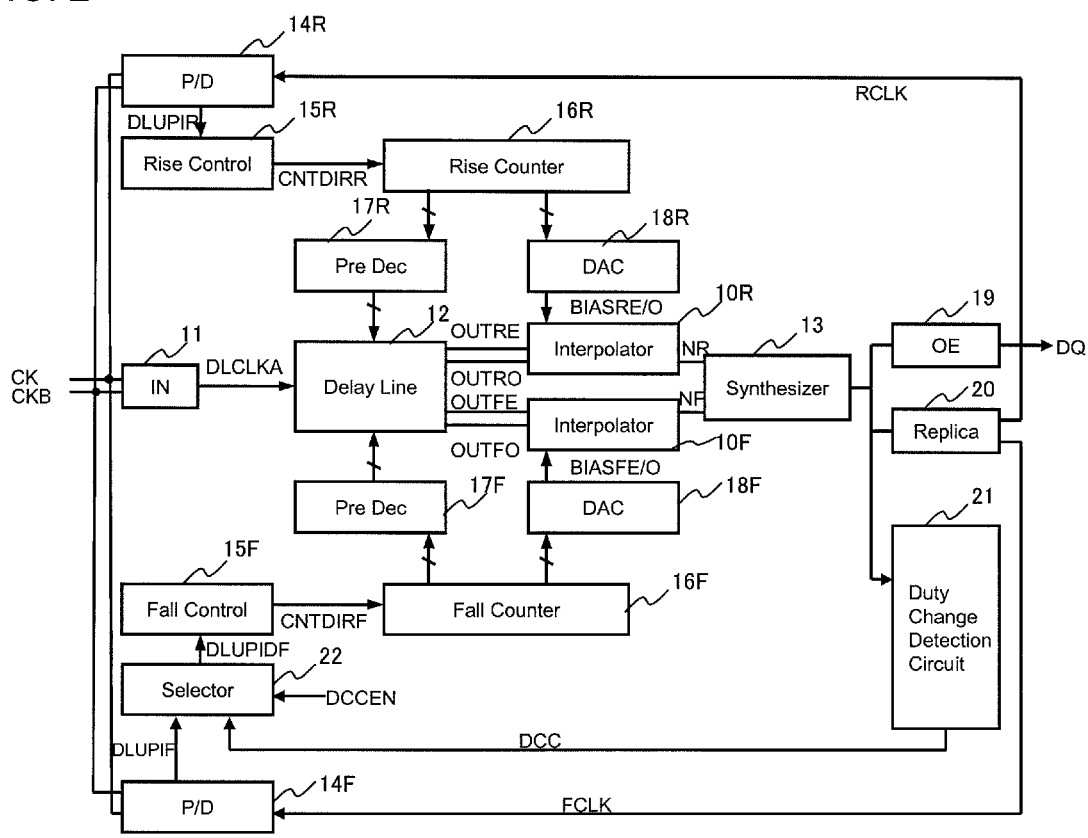
FIG. 2 is a schematic block diagram showing a configuration of a DLL according to an exemplary embodiment of the present invention.

FIG. 2 schematically shows an example configuration of the DLL shown in FIG. 1. CK and CKB of FIG. 2 correspond respectively to CK and /CK of FIG. 1. The DLL includes an input circuit (IN) 11, a variable delay circuit (Delay Line) 12, a pair of variable delay circuits (Interpolators) 10R and 10F, a synthesis circuit 13, a pair of phase detectors (P/Ds) 14R and 14F, a pair of Rise/Fall delay control circuits (Rise/Fall Control Circuits) 15R and 15F, a pair of Rise/Fall counters (Rise/Fall Counters) 16R and 16F, a pair of pre-decoders (Pre Decs) 17R and 17F, a pair of digital-to-analog converters (DACs) 18R and 18F, an output circuit (OE) 19, a replica (Replica) 20, a duty change detection circuit 21 and a selection circuit (Selector) 22. Both the variable delay circuit (Delay Line) 12 and the variable delay circuits (Interpolators) 10R and 10F include the time adjustment function. Specifically, the variable delay circuits (Interpolators) 10R and 10F perform fine time adjustment with a higher resolution and the variable delay circuit (Delay Line) 12 performs coarse delay adjustment with a resolution more coarse than that of the synthesis circuit 13.

The phase detector (P/D) 14R compares the phase of the rising edge of the external clock (CK) and that of an output RCLK of the replica 20 to each other.

The Rise delay control circuit 15R receives a phase comparison result output DLUPIR of the phase detector 14R to output an UP signal or a DOWN signal (CNTDIRR) to the Rise counter 16R. That is, the Rise delay control circuit 15R receives the result of phase comparison by the phase detector 14R to generate the control signal CNTDIRR to supply the so generated control signal to the counter 16R to control the count operation. Specifically, with the control signal CNTDIRR, control is exercised in such a manner that, if the phase of the rising edge of RCLK lags behind the phase of CK, the phase of the rising edge of RCLK is advanced, whereas, if the phase of the rising edge of RCLK leads the phase of CK, the phase of the rising edge of RCLK is delayed. The Rise delay control circuit 15R includes a buffer circuit (an inverting or non-inverting buffer).

Upper bits of the Rise counter 16R are pre-decoded by the pre-decoder 17R. The result of decoding by the pre-decoder 17R is supplied to the variable delay circuit 12. Lower bits of the Rise counter 16R are supplied to the digital-to-analog converter 18R which generates BIASRE for Even (even-number) and BIASRO for Odd (odd-number). In generating the two bias voltages BIASRE and BIASRO by the digital-to-analog converter 18R, a current mode digital-to-analog converter 18R may be used to differentially generate currents corresponding to the lower bits of the counter 16R to convert the differential currents to respective voltages to generate the BIASRE and BIASRO. See e.g. FIG. 1 of Patent Document 2. Alternatively, with the voltage mode digital-to-analog converter 18R, the bias voltage for Even (BIASRE) is VCM+$\Delta V/2$ where $\Delta V$ is a common voltage, and the bias voltage for Odd (BIASRO) is VCM−$\Delta V/2$ (BIASRE−BIASRO=$\Delta V$). The digital-to-analog converter 18R may then generate the voltage $\Delta V$ corresponding to the lower bits of the counter 16R to add (½) $\Delta V$ to VCM and or to subtract (½) $\Delta V$ from VCM. In actuality, it is the current that is so added or subtracted, and the result is converted to a voltage.

The phase detector (P/D) 14F compares the phase of a falling edge of the external clock (CK) and that of an output FCLK of the replica 20 to output the result of phase detection DLUPIF to the selection circuit 22.

The Fall delay control circuit 15F receives the output DLUPIDF of the selection circuit 22 to output an UP or DOWN signal (CNTDIRF) to the Fall counter 16F. For example, if the selection circuit 22 has selected the phase comparison result output DLUPIF of the phase detector 14F, the Fall delay control circuit 15F receives the result of phase comparison by the phase detector 14F to generate the control signal CNTDIRF to deliver the control signal to the Fall counter 16F to control the count operation. Specifically, the control signal CNTDIRR is used to exercise control in such a manner that, if the phase of the falling edge of FCLK lags behind the phase of CK, the falling edge of FCLK is advanced, whereas, if the phase of the falling edge of FCLK leads the phase of CK, the falling edge of FCLK is delayed. The delay control circuit 15F includes a buffer circuit (an inverting or non-inverting buffer), only by way of illustration.

The upper bits of the Fall counter 16F are pre-decoded by the pre-decoder 17F. The decoded result of the pre-decoder 17F is supplied to the variable delay circuit 12. The lower bits of the Fall counter 16F are supplied to the digital-to-analog converter 18F, which generates the two bias voltages BIASRE and BIASRO.

The input circuit (IN) 11 receives complementary external clock signals CK and CKB to output a clock signal DLCLKA, in phase with CK, as a single-ended output.

The variable delay circuit 12 receives decoded results of the pre-decoders 17R and 17F to determine the delay values of a line of delay elements of the delay line. The variable delay circuit 12 generates an Even delay signal OUTRE and an Odd delay signal OUTRO, in association with the rise of the clock signal DLCLKA. The variable delay circuit 12 also generates an Even delay signal OUTFE and an Odd delay signal OUTFO, in association with the fall of the clock signal DLCLKA. The variable delay circuit 12 performs delay adjustment with the Even/Odd time difference as a minimum delay unit. The Even/Odd time difference corresponds to two NAND circuit stages (unit delay).

The variable delay circuit 10R receives the Even delay signal OUTRE and the Odd delay signal OUTRO, generated from the rise transition of the external clock CK, and synthesizes OUTRE and OUTRO in accordance with the bias voltages BIASRE and BIASRO to output a synthesized signal. That is, the variable delay circuit 10R outputs a signal that rises with a delay corresponding to interpolation of the delay (phase difference) between the rising edges of the Even delay signal OUTRE and the Odd delay signal OUTRO at a ratio controlled by the bias voltages BIASRE and BIASRO. For example, if the ratio is 100% for the Even side and 0% for the Odd side, a waveform is synthesized with OUTRE=100% and OUTRO=0% to generate an output NR. That is, the transition timing of the transition timing of NR is made equal to that of OUTRE, provided that the inherent delay in propagating through the circuit is discounted. If the ratio is 50% for the Even side and 50% for the Odd side, a waveform is synthesized with OUTRE=50% and OUTRO=50% so that the output NR is output at a mid timing between OUTRE and OUTRO (a mid value of the OUTRE transition timing and the OUTRO transition timing) plus inherent delay in propagating through the circuit.

The variable delay circuit 10F receives the Even delay signal OUTFE and the Odd delay signal OUTFO, generated from the fall transition of the external clock CK, and synthesizes OUTFE and OUTFO in accordance with the bias voltages BIASFE and BIASFO to output the synthesized signal. That is, the variable delay circuit 10R outputs a signal that falls with a delay corresponding to interpolation of the delay (phase difference) of the falling edges of the Even delay signal OUTFE and the Odd delay signal OUTFO at a ratio controlled by the bias voltages BIASFE and BIASFO. An output signal NF from the variable delay circuit 10F may rise to HIGH in response to fall to LOW of OUTFE and OUTFO. In this case, if inverted signals of OUTFE and OUTFO are supplied to the variable delay circuit 10F, the variable delay circuit 10F may be of the same configuration as the variable delay circuit 10R.

With the variable delay circuits 10R/10F, it is possible to adjust the delay with the time resolution finer than the minimum delay time unit proper to the variable delay circuit 12, such as absolute delay time value corresponding to two NAND stages, for example. It is thus made possible to cope with the frequency of the high-speed operation, while maintaining necessary time resolution and necessary precision.

The synthesis circuit 13, responsive to the output signal NR from the variable delay circuit 10R, associated with rise transition of the external clock CK, and the output signal NF from the variable delay circuit 10F, associated with fall transition of the external clock CK, generates a synthesized output signal that rises in association with the rise transition of the output signal NR and that falls in association with the fall transition of the output signal NF. The synthesis circuit 13 is of a circuit configuration equivalent to a commonly used flip-flop which includes two stages of inverters having inputs cross-coupled to outputs (the synthesis circuit, however, is designed to be of high accuracy).

The replica 20 is a circuit that simulates an output DQ, and that has a delay equivalent to that of an actual signal route extending from a DLL output (output of the synthesis circuit 13) to the output data terminal DQ. Since it is only sufficient for the replica 20 to replicate or simulate an output delay, those components that are not essential may be deleted to simplify the circuit. The replica 20 outputs a Rise side clock RCLK in phase with the external clock CK and a Fall side clock RCLK in phase with the external clock CKB (reverse phase with respect to RCLK).

The output circuit (OE) 19 is provided in the input and output buffer 1-13 of FIG. 1, and serially outputs read data from a terminal DQ in synchronization with the rise and fall of a DLL output (clock) from the first synthesis circuit (synthesizer) 13. The OE 50 includes a multiplexer that receives two read data as inputs in parallel, for example, to select and output one input depending on the value of the DLL output.

The duty change detection circuit 21 receives an output of the synthesis circuit 13 (DLL output) to change a duty of the output of the synthesis circuit 13. The duty change information DCC is supplied to the selection circuit 22.

The selection circuit 22 selects the output DLUPIF of the phase detector 14F or the output DCC of the duty change detection circuit 21, based on an input selection control signal DCCEN, to supply the so selected output to the Fall delay control circuit 15F. The selection control signal DCCEN is supplied, for example, from the control logic 1-10 of FIG. 1.

Figure 3:
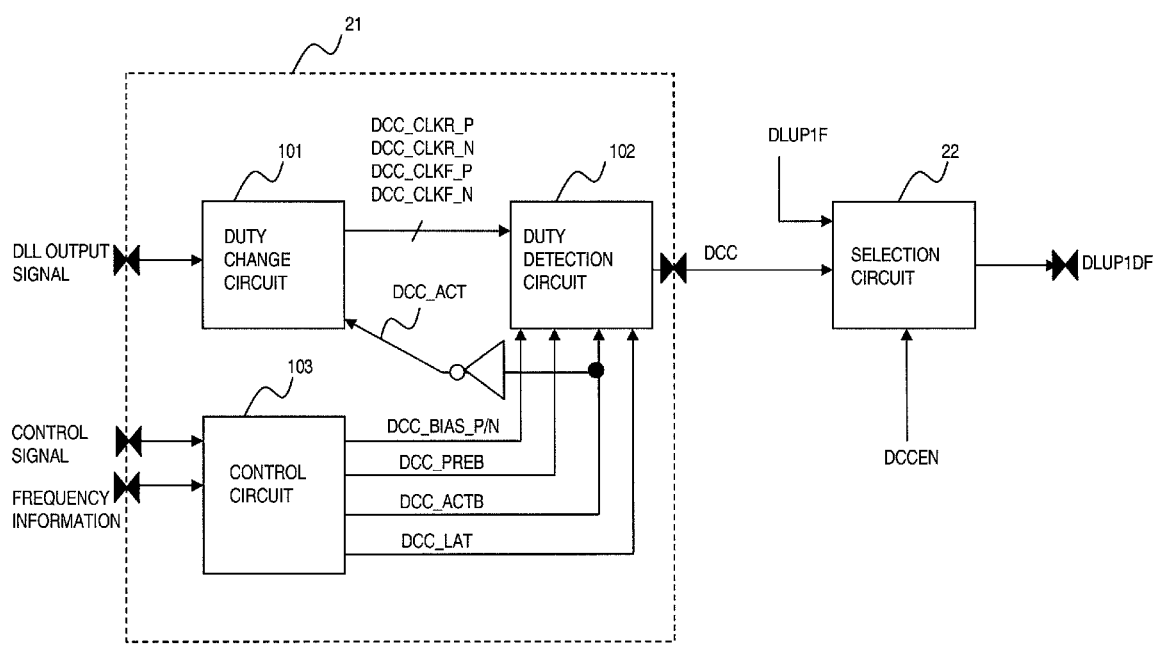
FIG. 3 is a schematic block diagram showing a configuration of a duty change detection circuit according to an exemplary embodiment of the present invention.

FIG. 3 shows am example of the configuration of the duty change detection circuit 21 of FIG. 2. Referring to FIG. 3, the duty change detection circuit 21 includes a duty change circuit 101, a duty detection circuit 102 and a control circuit 103.

The duty change circuit 101 receives an output of the synthesis circuit 13 (DLL output signal) to generate signals DCC_CLKR_P/N and DCC_CLKF_P/N from the DLL output signal to supply the so generated signals to the duty detection circuit 102. The duty change circuit 101 changes the duty of the DLL output signal to make the duty detection circuit 102 operate with the so generated four signals DCC_CLKR_P/N and DCC_CLKF_P/N. With the present exemplary example, the duty of the signal supplied to the duty detection circuit 102 is changed before duty detection.

The control circuit 103 receives a control signal and a frequency signal to generate a pre-charge signal (DCC_PREB), a corresponding stop signal (DCC_ACTB) and a latch signal (DCC_LAT). The control circuit 103 supplies a bias voltage DCC_BIAS_P/N to the duty detection circuit 102. The control signal and the frequency signal are supplied from the control logic 1-10 of FIG. 1 to the control circuit 103. The duty change circuit 101 receives a signal DCC_ACT obtained by inverting by an inverter the stop signal (DCC_ACTB) which is supplied from the control circuit 103, to control the output operation of the signals DCC_CLKR_P/N and DCC_CLKF_P/N.

The duty detection circuit 102 receives DCC_CLKF_P/N and DCC_CLKR_P/N from the duty change circuit 101. The duty detection circuit 102 also receives the bias signal DCC_BIAS_P/N, pre-charge signal DCC_PREB, activation signal DCC_ACTB and the latch signal DCC_LAT from the control circuit 103 to detect the duty.

In the present exemplary embodiment, the duty detection circuit 102 outputs a duty detection result once a plurality of cycles, such as eight cycles, of the external signal (CK), for example. It is thus necessary to provide a time period during which a node within the duty detection circuit 102 is pre-charged. During the time period in which a node in the duty detection circuit 102 is pre-charged, it is necessary to stop the input of DCC_CLKF_P/N and DCC_CLKR_P/N to the duty detection circuit 102, or stop the output of DCC_CLKF_P/N and DCC_CLKR_P/N from the duty change circuit 101. The activation signal DCC_ACTB (LOW active) output from the control circuit 103 is supplied to the duty detection circuit 102, and the DCC_ACT which is an inverted version of DCC_ACTB is supplied to the duty change circuit 101.

The selection circuit 22 selects one of the output signal DCC of the duty change detection circuit 21 and the output signal DLUPIF of the phase detector (P/D) 14F, based on the selection control signal DCCEN. If the output signal DCC of the duty change detection circuit 21 is selected by the selection circuit 22, the output signal DCC of the duty change detection circuit 21 is supplied via the Fall delay control circuit 15F to the Fall counter 16F.

Figure 4:
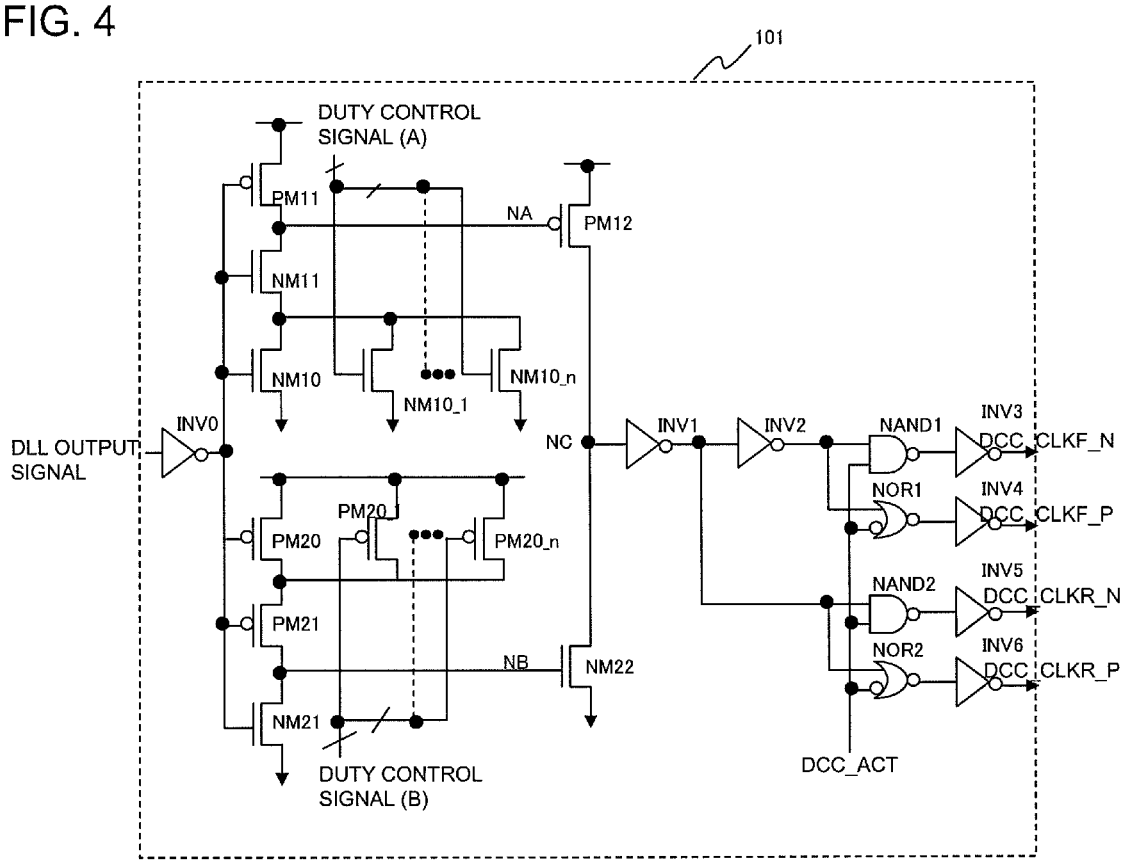
FIG. 4 is a diagram showing a configuration of a duty change circuit according to an exemplary embodiment of the present invention.

FIG. 4 shows an example configuration of the duty change circuit 101 of FIG. 3. Referring to FIG. 4, the duty change circuit 101 includes:

a PMOS transistor PM11 and NMOS transistors NM11 and NM10, connected between power supplies VDD and VSS;

NMOS transistors NM10_1 to NM10_n which have sources connected to the power supply VDD, have drains connected to the drain of the NMOS transistor NM10 and have gates supplied with a plurality of duty control signals (A), respectively;

PMOS transistors PM20, PM21 and an NMOS transistor NM21, connected between the power supplies VDD and VSS;

PMOS transistors PM20_1 to PM20_n which have sources connected to the power supply VDD, have drains connected to the drain of the PMOS transistor PM20, and have gates supplied with a plurality of duty control signals (B), respectively;

a PMOS transistor PM12 which has a source connected to the power supply VDD, has a gate connected to a connection node NA of the drain of the PMOS transistor PM11 and the drain of the NM transistor NM11; and an NMOS transistor NM22 which has a source connected to the power supply VSS, has a drain connected to a drain of the PMOS transistor PM12 and has a gate connected to a connection node NB of the drain of the NMOS transistor NM21 and the drain of the PMOS transistor PM11.

A plurality of duty control signals (A) and a plurality of duty control signals (B) are associated with NMOS transistors NM20_1 to 20_n and PMOS transistors PM20_1 to 20_n, respectively, in accordance with a duty correction value (offset value).

The duty change circuit 101 also includes:

an inverter INV1 having an input connected to a connection node NC (node NC) between the drain of the PMOS transistor PM12 and the drain of the NMOS transistor NM22;

an inverter INV2 having an input connected to an output of the inverter INV1;

a NAND gate NAND1 that receives an output of the inverter INV2 and DCC_ACT;

an inverter INV3 having an input connected to an output of NAND1;

a NOR gate NOR1 that receives an output of the inverter INV2 and DCC_ACT;

an inverter INV4 having an input connected to an output of NOR1;

a NAND gate NAND2 that receives an output of the inverter INV1 and DCC_ACT;

an inverter INV5 having an input connected to an output of NAND2;

a NOR gate NOR2 that receives an output of the inverter INV1 and DCC_ACT; and an inverter INV6 having an input connected to an output of NOR2.

The inverters INV3, INV4, INV5 and INV6 output DCC_CLKF_N, DCC_CLKF_P, DCC_CLKR_N and DCC_CLKR_P, respectively.

The fall time of the gate node NA of the PMOS transistor PM12 may be varied by varying the value of the duty control signals (A) which are supplied to the gates of the NMOS transistors NM10_1 to NM10_n, respectively. When the DLL output signal transitions from HIGH to LOW, the inverter INV0 transitions from LOW to HIGH to make the NMOS transistors NM10 and NM11 conductive to discharge the gate node NA of the PMOS transistor PM12 to set its potential to LOW. This makes the PMOS transistor PM21 conducive to set the node NC to HIGH. In case the duty control signals (A) which are supplied to the gates of the NMOS transistors NM10_1 to NM10_n are all brought HIGH, the NMOS transistors NM10_1 to NM10_n are all made conductive. The source of the NMOS transistor NM11 is discharged by the NMOS transistors NM10_1 to NM10_n without waiting for the NMOS transistor NM10 to be made conductive. This expedites the falling of the node NA to the LOW potential. If conversely the NMOS transistors NM10_1 to NM10_n are all made non-conductive, the source of the NMOS transistor NM11 is discharged by the NMOS transistor NM10 that has been made conductive, thus retarding the falling of the node NA to the LOW potential.

The respective nodes in the duty change detection circuit 21 that corrects and detects the duty ratio in response to the DLL output signal are highly sensitive in securing duty accuracy, such that it is necessary to pay attention to parasitic resistance and to parasitic capacitance. In this consideration, the drains of the NMOS transistors NM10_1 to NM10_n are not connected to the node NA, and the source resistance of the NMOS transistor NM11 is made variable to control the discharge current. The same holds for the node NB and the PMOS transistors PM20_1 to PM20_n which will be described later.

The same holds for the succeeding circuit (INV1 to INV6, NAND1, NAND2, NOR1 and NOR2). The succeeding circuit of the duty change circuit 101 transfers the waveform of the node NC to the duty detection circuit 102 in such a manner that the waveform of the node NC that has reflected the corrected duty is faithfully maintained.

The rise time of the gate node NB of the NMOS transistor NM22 is varied by varying the values of the duty control signals (B) supplied to the gates of the PMOS transistors PM20_1 to PM20_n, respectively. When the DLL output signal transitions from LOW to HIGH, the inverter INV0 transitions from HIGH to LOW to make the PMOS transistors PM20, PM21 conductive to charge the gate node NB of the NMOS transistor NM22 to set it to a HIGH potential. This makes the NMOS transistor NM22 conductive to set the node NC to LOW. When the duty control signal (B) supplied to all of the gates of the PMOS transistors PM20_1 to PM20_n is set to LOW, the PMOS transistors PM20_1 to PM20_n are made conductive. This causes the source of the PMOS transistor PM21 to be charged by the PMOS transistors PM20_1 to PM20_n, without waiting for the PMOS transistor PM20 to be made conductive, thus expediting the rise of the node NB to a HIGH potential. When the PMOS transistors PM20_1 to PM20_n are all made conductive, the source of the PMOS transistor PM21 is charged by the transistor PM20 which has been made conductive, thus retarding the rising of the node NB to the HIGH potential.

Thus, by setting the duty control signals (A) and (B), the rising and falling waveforms of the output signal from the connection node NC of the drains of the PMOS transistor PM12 and the NM transistor NM22 are varied, thus changing the duty. Meanwhile, if DCC_ACT is LOW, DCC_CLKF_N and DCC_CLKR_N are fixed at LOW, while DCC_CLKF_P and DCC_CLKR_P are fixed at HIGH. If DCC_ACT is HIGH, DCC_CLKR_P and DCC_CLKR_N rise in synchronization with the rising edge of the DLL output. In this case, the HIGH period (pulse width) of the resulting pulse waveform corresponds to the HIGH period of the DLL output. On the other hand, DCC_CLKF_P and DCC_CLKF_N rise in synchronization with the falling edge of the DLL output. In this case, the HIGH period (pulse width) of the pulse waveform corresponds to the LOW period of the DLL clock.

The duty control signals (A) and (B) alone may control the duty correction value (offset value). The duty control signals (A) and (B) may also be combined to further improve the waveform accuracy of the node NC.

Figure 5:
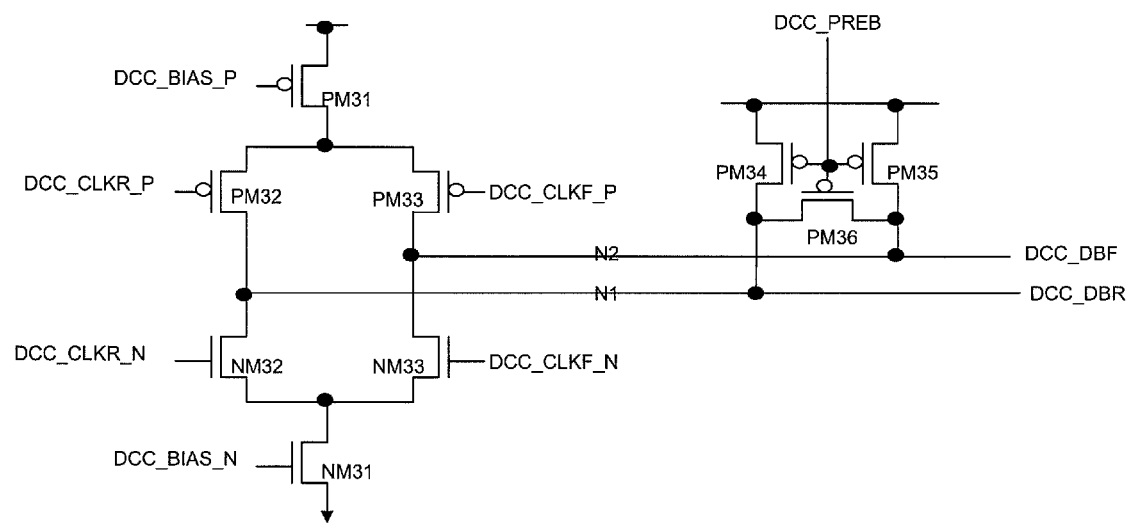
FIG. 5 is a diagram showing a configuration of a pre-stage of a duty change circuit according to an exemplary embodiment of the present invention.

FIG. 5 shows an example configuration of a portion (pre-stage) of the duty detection circuit 102. The configuration of the post-stage of the duty detection circuit 102 is described later with reference to FIG. 6.

Referring to FIG. 5, the duty detection circuit 102 is responsive to output signals DC_CLKF_P/N and DC_CLKR_P/N of the duty change circuit to charge/discharge the nodes N1 and N2. The voltages at the nodes N1 and N2 are output as DCC_DBR and DCC_DBF, respectively.

Referring to FIG. 5, the duty detection circuit includes:

a PMOS transistor PM31 that has a source connected to the power supply VDD and receives a bias voltage DCC_BIAS_P at its gate;

PMOS transistors PM32 and PM33 that have sources connected in common to the drain of the PMOS transistor PM31 and receive signals DCC_CLKR_P and DCC_CLKF_P at their gates, respectively;

NMOS transistors NM32 and NM33 that have drains connected to the drains of the PMOS transistors PM32 and PM33, respectively, receive signals DCC_CLKR_N and DCC_CLKF_N at their gates, respectively, and have sources coupled together; and an NMOS transistor NM31 that has a drain connected to coupled sources of the NMOS transistors NM32 and NM33, receives a bias DCC_BIAS_N at its gate and has a source connected to a power supply VSS.

The duty detection circuit also includes:

PMOS transistors PM34 and PM35 that have sources connected in common to a power supply, have drains connected respectively to nodes N1 and N2, which are drains of the NMOS transistors NM32, NM33, respectively, and have gates connected in common to a pre-charge signal DCC_PREB; and a PMOS transistor PM36 that has a source and a drain connected between nodes N1 and N2 and has a gate connected to DCC_PREB.

The circuit operation of FIG. 5 will now be described. When the signals DCC_CLKR_P, DCC_CLKR_N, DCC_CLKF_P and DCC_CLKF_N from the duty change circuit 101 are HIGH, LOW, HIGH and LOW, respectively, the PMOS transistors PM32 and PM33 are made non-conductive, and the NMOS transistor NM32 and NM33 are made non-conductive. The nodes N1 and N2 which have been pre-charged by PMOS transistors PM34 to PM36, are in floating states. That is, after pre-charging by PMOS transistors PM34 and PM36 to the power supply voltage, the nodes N1 and N2 are in floating states for a prescribed time period. Since the outputs DCC_CLKR_P and DCC_CLKR_N of the duty change circuit 101 are both HIGH, the rise side DCC_DBR is discharged from the prescribed voltage to which it has been pre-charged beforehand. The Rise side outputs DCC_CLKR_P and DCC_CLKR_N of the duty change circuit, matched to the transitions of the DLL output signal, are then brought LOW to charge DCC_DBR. The above sequence of operations is repeated.

The Fall side output signals DCC_CLKF_P and DCC_CLKF_N from the duty change circuit 101 repeat the above-described charging/discharging operations in reverse phase relationship to the Rise side outputs DCC_CLKR_P and DCC_CLKR_N. The ultimately reached voltages of the output signals DCC_DBF and DCC_DBR become respective output signals of the duty detection circuit 102. The output signals DCC_DBR and DCC_DBF are differentially amplified and latched by a circuit which will be explained subsequently with reference to FIG. 6.

After latching of the output signals DCC_DBR and DCC_DBF, the nodes N1 and N2 are pre-charged and equalized to a power supply voltage by the pre-charging circuit (PM34 to PM36) in readiness for discharging for next duty detection. In the present example, the result of duty detection is output once every eight cycles of the external signal CK.

The Fall side signal DCC_CLKF_P/N and the Rise side signal DCC_CLKR_P/N from the duty change circuit 101 are reverse phase relative to each other. This can be expressed as follows:

[discharging time of node N1 by $DCC\_CLKR\_P/N$]= [charging time of node N2 by $DCC\_CLKF\_P/N$].

That is, since [the discharging time of node N1 by DCC_CLKR_P/N being long] means [the charging time of node N2 by DCC_CLKF_P/N being long], as regards DCC_DBF (N2) and DCC_DBR (N1), DCC_DBR is discharged more and more, while DCC_DBF is charged more and more.

As a result, a potential difference (=ΔV) is generated between DCC_DBF and DCC_DBR (see FIG. 7D).

The potential difference ΔV between DCC_DBF and DCC_DBR being zero (voltage of DCC_DBF=voltage of DCC_DBR) means that the duty value of the DLL output signal is 50%.

ΔV=(DCC_DBF−DCC_DBR)>0 (see FIG. 7D) means that DCC_DBR is discharged more and more, DCC_DBF is charged more and more, and the HIGH period of the DLL output is shorter than its LOW period, with the duty value being less than 50%.

If conversely ΔV=(DCC_DBF−DCC_DBR)<0, such state means that DCC_DBF is discharged more and more, DCC_DBR is charged more and more, and the HIGH period of the DLL output is longer than its LOW period, with the duty value exceeding 50%.

Thus, by changing the duty of the input signals (DCC_CLKF_P/N, DCC_CLKR_P/N) of the duty detection circuit 102 by the duty change circuit 101, the duty can be (intentionally) changed without meddling with the duty detection circuit 102, with the high charging characteristic and high discharging characteristic of the nodes N1 and N2 in the duty detection circuit 102 being maintained.

With the duty detection circuit 102, the duty value of 50% is set as the value of the reference duty without dependency upon the external signal. With the present invention, the duty of the waveform of an output of the DLL circuit (output of the synthesis circuit 13) is changed by the duty change circuit 101. The duty detection circuit 102 performs comparison and verification of the so changed duty value in accordance with the reference duty value of 50%. The Fall delay control circuit 15F controls the variable delay circuits 12 and 10F in accordance with the result of detection of the comparison and verification (DCC). As a result, the duty value as seen from the duty detection circuit 102 is the aforementioned reference duty value. Thus, by affording −5% offset (the duty value then being 45%) with respect to the output of the DLL circuit to the duty detection circuit 102, the DLL circuit outputs a +5% signal (the duty value being 55%.) If conversely the +5% offset value is afforded to the duty detection circuit 102, the DLL circuit outputs a −5% signal (the duty value being 45%). That is, the duty value of the output signal of the DLL is the aforementioned reference duty value plus or minus the offset duty value (absolute value) corresponding to the variation amount.

With the present exemplary embodiment, described above, the duty change circuit 101 is arranged at a portion where the four signals (DCC_CLKF_P/N and DCC_CLKR_P/N) to be supplied to the duty detection circuit 102 are generated, as the duty detection circuit 102 that affects precision and circuit characteristics is not meddled with. By so arranging the duty change circuit, it is possible to change the duty of the input signals (DCC_CLKF_P/N and DCC_CLKR_P/N) of the duty detection circuit 102.

In the duty detection circuit 102, the transistors PM31 and NM31 that receive the bias voltages DCC_BIAS_P and DCC_BIAS_N, respectively, adjust the time the nodes N1 and N2 are charged/discharged by the signals from the duty change circuit 101 (DCC_CLKR_P/N and DCC_CLKF_P/N). The control circuit 103 generates the bias signals DCC_BIAS_P and DCC_BIAS_N as the frequency (information on the operation frequency) from the control logic 1-10 and the charging/discharging capabilities (current driving capabilities) of the transistors having gates supplied with DCC_CLKR_P/N and DCC_CLKF_P/N, respectively, are taken into account. The charging/discharging capabilities (current driving capabilities) of the transistors having gates supplied with DCC_CLKR_P/N and DCC_CLKF_P/N, may be found by a test conducted at the time of device manufacture for recording in a ROM (Read Only Memory) in the control circuit 103.

In the present exemplary embodiment, the results of duty detection (DCC_DBR, DCC_DBF) are output once every multiple clock cycles, such as every eight cycles, for example. Thus, the nodes N1 and N2 are pre-charged every eight cycles. At this time, DCC_ACT is brought LOW, DCC_CLKR_P/DCC_CLKR_N are HIGH/LOW, DCC_CLKF_P/DCC_CLKF_N are HIGH/LOW, and the nodes N1 and N2 are in floating states. In this state, the signal DCC_PREB is brought LOW and the nodes N1 and N2 are pre-charged/equalized to the power supply voltage VDD. After the end of the pre-charge period (one of the eight cycles), DCC_PREB is brought HIGH. DCC_CLKR_P/N and DCC_CLKF_P/N are output in response to the rise and fall edges of the DLL output pulse, respectively.

During the HIGH period of DCC_CLKR_N, the NMOS transistor NM32 is made conductive to discharge the node N1. During the LOW period of DCC_CLKR_P, the PMOS transistor PM32 is made conductive to charge the node N1 to the power supply VDD. During the HIGH period of DCC_CLKF_N, the NMOS transistor NM33 is made conductive to discharge the node N2. During the LOW period of DCC_CLKF_P, the PMOS transistor PM33 is made conductive to charge the node N2 to the power supply voltage. If, after the operation has been carried out a plurality of cycles with regard to the DLL output clock, the voltage of DCC_DBR is equal to the voltage of DCC_DBF, the duty is 50%. If DCC_DBF is lower in potential than DCC_DBR, the HIGH period of DCC_CLKR_N, corresponding to the LOW period of the DLL output, is longer than the HIGH period of DCC_CLKF_N corresponding to the LOW period of the DLL output. The HIGH period of the DLL output clock pulse is longer than its LOW period (duty being larger than 50%).

Figure 6:
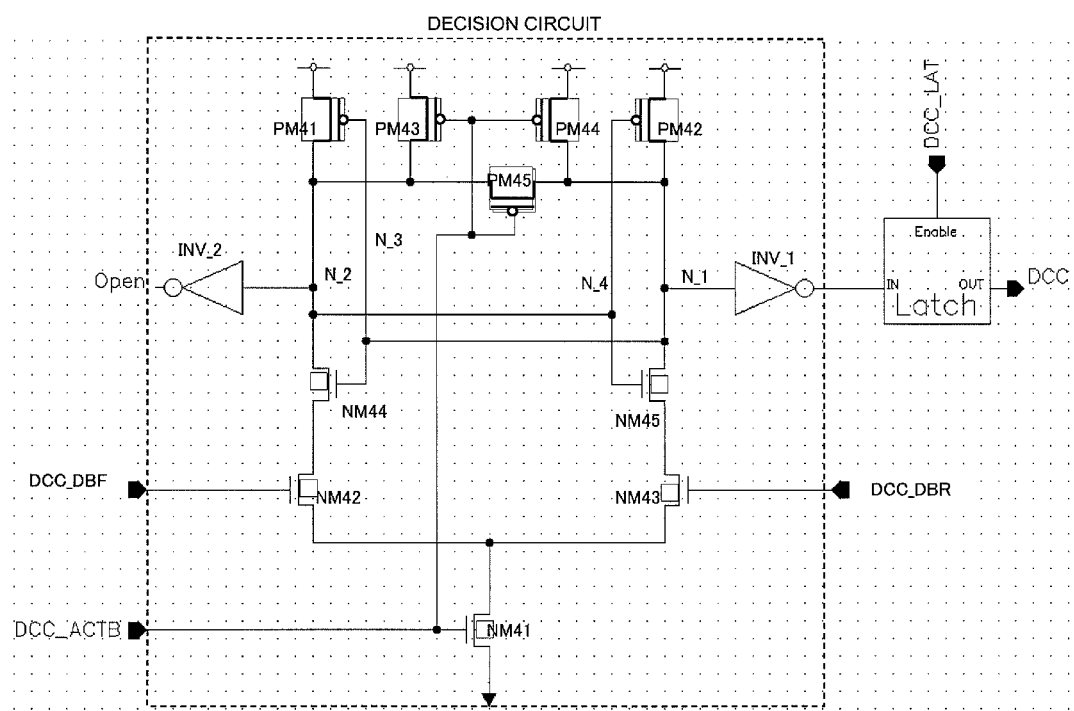
FIG. 6 is a diagram showing a configuration of a post-stage of the duty change circuit according to the exemplary embodiment of the present invention.

FIG. 6 shows an example configuration of a portion (downstream side stage) of the duty detection circuit 102. The configuration of the pre-stage of the duty detection circuit 102 is shown in FIG. 5. The post-stage of the duty detection circuit 102 includes a decision circuit that decides on which of two output signals (DCC_DBF and DCC_DBR) of the pre-stage of the duty detection circuit 102 is higher in level, and a latch circuit that latches the result of decision by the decision circuit.

Referring to FIG. 6, the decision circuit includes a differential pair that differentially receives DCC_DBF and DCC_DBR, and two inverters having inputs and outputs cross-coupled (flip-flop). Specifically, the decision circuit includes a differential pair (NM42, NM43) and two inverters (PM41, NM44) and (PM42, NM45). The coupled sources of the differential pair (NM42, NM43) are connected to a current source transistor NM41 that is made conductive or non-conductive by DCC_ACTB. The differential pair differentially receives DCC_DBF and DCC_DBR. The two inverters (PM41, NM44) and (PM42, NM45) are connected between differential outputs of the differential pair (NM42, NM43) and the power supply VDD, and have inputs coupled to outputs of the counterpart side inverters, while having outputs coupled to inputs of the counterpart side inverters. The decision circuit further includes a circuit (PM43 to PM45) that pre-charges and equalizes output nodes N_1 and N_2 of the inverters (PM42, NM45) and (PM41, NM44) and inverters (inverting buffers) INV_1 and INV_2 coupled to the output nodes N_1 and N_2, respectively.

More specifically, the decision circuit includes:

an NMOS transistor NM41 that has a source connected to VSS and has a gate supplied with the signal DCC_ACTB;

NMOS transistors NM42 and NM43 which have sources connected together to the drain of the NMOS transistor NM41, and have gates receive supplied with the signals DCC_DBF and DCC_DBR, respectively;

NMOS transistors NM44 and NM45 which have sources connected to the drains of the NMOS transistors NM42 and NM43, respectively;

PMOS transistors PM41 and PM42 which have sources connected to the power supply VDD, have drains connected to the drains of the NMOS transistors NM44 and NM45, respectively and have gates connected to the gates of the NMOS transistors NM44 and NM45, respectively;

PMOS transistors PM43 and PM44 which have sources connected to the power supply VDD, have drains connected respectively to the drain nodes N_2 and N_1 of the PMOS transistors PM41 and PM42 and have gates coupled to DCC_ACTB;

a PMOS transistor PM45 which are connected between the drain nodes N_1 and N_2 of the PMOS transistors PM41 and PM42 and have gates coupled to DCC_ACTB, and inverters INV_1 and INV_2 which have inputs connected respectively to the nodes N_1, and N_2. The output of the inverter INV_1 is supplied to a data terminal of a latch (Latch). The output of the inverter INV_2 is open.

When the latch signal DCC_LAT is HIGH, the latch (Latch) outputs the result of decision by the control circuit (output of the inverter INV1_1) as DCC.

The circuit operation of FIG. 6 will now be described. When the DCC_ACTB is LOW, the NMOS transistor NM41 is made non-conductive, while the PM transistors PM42, PM43 and PM45 are made conductive to pre-charge and equalize the nodes N_1 and N_2 to the power supply voltage VDD.

When the DCC_ACTB is HIGH, the NMOS transistor NM is made conductive, while the PMOS transistors PM43 to PM45 are made non-conductive.

If, in the differential pair (NM42, NM43) that differentially receives DCC_DBF and DCC_DBR, DCC_DBF is higher in its potential than DCC_DBR (ΔV=DCC_DBF−DCC_DBR>0), the drain current of the NMOS transistor NM42 becomes larger than that of the NMOS transistor NM43. Since the gates of the NMOS transistors NM44 and NM45 are pre-charged to the power supply voltage VDD, the NMOS transistors NM44 and NM45 are both in on (conductive)-states. The node N_2 is discharged in this state with a current larger than the current at the node N_1. Thus, when the voltage at the node N_2 is below the power supply voltage VDD minus the threshold voltage of the PMOS transistor PM42, the PMOS transistor PM42 is made conductive. When the voltage at the node N_2 (=gate potential of the NMOS transistor NM45) has become lower than the source voltage of the NMOS transistor NM45 plus its threshold voltage, the NMOS transistor NM45 is made non-conductive, so that the discharging of the node N_1 ceases. The node N_1 is kept in its HIGH state by the PMOS transistor PM42 which is in the on state. The output of the inverter INV_1 thus goes LOW. The NMOS transistor NM44 having a gate supplied with HIGH of the node N_1, is made conductive, while the PMOS transistor PM41 is made non-conductive, as a result of which the node N_2 is in LOW state.

If, in the differential pair (NM42, NM43), DCC_DBF is lower in its potential than DCC_DBR (ΔV=DCC_DBF−DCC_DBR<0), the drain current of the NMOS transistor NM43 becomes larger than the drain current of the NMOS transistor NM42. Since the gates of the NMOS transistors NM44 and NM45 are pre-charged to a HIGH potential, the NMOS transistors NM44 and NM45 are both in on-states. The node N_1 is discharged with a current larger than that at the node N_2. When the voltage at the node N_1 has become less than power supply voltage VDD minus the threshold voltage of the PMOS transistor PM41, the PMOS transistor PM41 is made conductive. When the voltage at the node N_1 (=gate potential of the NMOS transistor NM44) has become lower than the source voltage of the NMOS transistor NM44 plus its threshold voltage, the NMOS transistor NM44 is made non-conductive. The node N_2 is maintained in a HIGH state. The NMOS transistor NM45 having a gate supplied with HIGH of the node N_2, is conductive, while the PMOS transistor PM42 is non-conductive. The node N1 is in LOW state so that the output of the inverter INV_1 is HIGH.

ΔV=DCC_DBF−DCC_DBR=0 corresponds to the duty 50%, as set forth above. In the duty detection circuit 102, the decision circuit of FIG. 6 outputs the result of whether the duty of the DLL output signal detected is larger or smaller than 50% (ΔV=DCC_DBF−DCC_DBR>0 or ΔV<0) as a bi-level logical signal to the selection circuit 22.

If the duty of the DLL output signal detected is larger than 50% (DCC_DBF<DCC_DBR), the output of the decision circuit is HIGH. If conversely the duty of the DLL output signal detected is smaller than 50%, the output of the decision circuit is LOW.

When the latch signal DCC_LAT is HIGH, the latch circuit (Latch) outputs the output signal of the decision circuit to the selection circuit 22 through. When the latch signal DCC_LAT is LOW, the latch circuit holds and outputs an output signal of the decision circuit that has prevailed when the latch signal DCC_LAT has transitioned from HIGH to LOW. The latch circuit controls the delay control circuit 15F with the output signal DCC of the decision circuit of the previous cycle until the result of duty detection DCC is output for the next eight cycles of the external signal (CK).

If, in the present exemplary embodiment, the duty of the DLL output signal is larger than 50%, the output signal DCC of the duty detection circuit 102 is HIGH, whereas, if the duty of the DLL output signal is smaller than 50%, the output signal of the duty detection circuit 102 is LOW. It should be understood that this is by way of illustration only and is not intended to limit the present invention.

FIG. 7 depicts a timing waveform diagram for illustrating the operation of the pre-stage of the duty detection circuit 102 explained with reference to FIG. 5. In FIG. 7, (a) denotes a voltage waveform of a DLL output, (b) that of DCC_CLKF_P/N, (c) that of DCC_CLKR_P/N, (d) that of DCC_DBR/DCC_DBF and (e) denotes that of DCC_LAT and DCC_PREB.

DCC_CLKF_P and DCC_CLKF_N are generated in response to a falling edge of the DLL output pulse of FIG. 7(a). DCC_CLKR_P and DCC_CLKR_N are generated in response to a rising edge of the DLL output pulse.

The duty is detected once every eight clock cycles, as set forth above. DCC_ACT is brought LOW, while DCC_CLKF_N and DCC_CLKR_N are brought LOW. DCC_CLKF_P and DCC_CLKR_P are brought HIGH. The nodes N_1 and N_2 are set to floating states. DCC_PREB is brought LOW to pre-charge DCC_DBR and DCC_DBF to a prescribed voltage (power supply voltage VDD) (pre-charging period).

The operation of duty detection is then carried out as DCC_ACT is set to HIGH. DCC_DBR and DCC_DBF are discharged during the HIGH period of DCC_CLKR_N and DCC_CLKF_N. DCC_DBR and DCC_DBF are charged during the LOW period of DCC_CLKR_P and DCC_CLKF_P. This operation is repeated four cycles, only by way of illustration. At a sixth cycle, DCC_ACT is brought LOW. DCC_CLKR_N and DCC_CLKR_P are brought LOW and HIGH, respectively. After one-half cycle, DCC_CLKF_P and DCC_CLKR_P are brought HIGH and LOW, respectively, with the nodes N_1 and N_2 being in floating states. The voltage difference between DCC_DBR and DCC_DBF is determined by a decision circuit and a decision output of the decision circuit at the eighth cycle is output in accordance with DCC_LAT.

Figure 8:
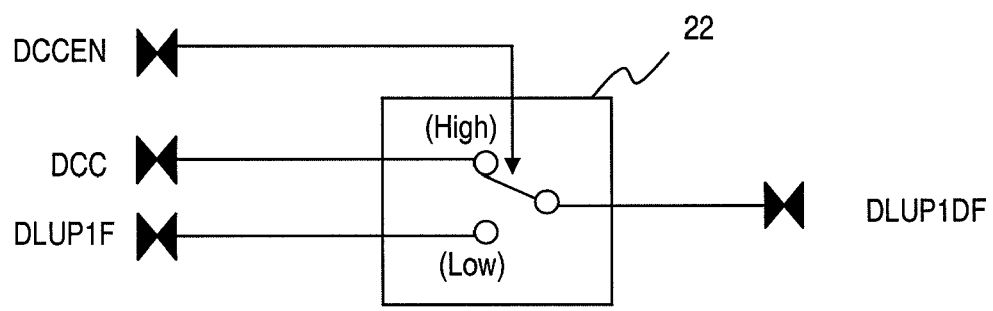
FIG. 8 is a schematic block diagram showing a configuration of a selection circuit according to an exemplary embodiment of the present invention.

FIG. 8 schematically shows the configuration of the selection circuit 22 of FIGS. 2 and 3. The selection circuit 22 receives an output DCC of the duty change detection circuit 21 and an output DLUPIF of the phase detector ((P/D) 14F as two inputs to select one of the two inputs in accordance with the selection control signal DCCEN. The output of the selection circuit 22 is transferred to one of the Rise delay control circuit 15R and the Fall delay control circuit 15F.

In the present exemplary embodiment, if the duty value of the DLL output signal is greater than 50%, the duty change detection circuit 21 outputs a HIGH output signal. If the duty value is smaller than 50%, the duty change detection circuit outputs a LOW output signal. Hence, the output (DCC) of the duty change detection circuit 21 has the same meaning as the signal DLUPIF from the phase detector (P/D) (a signal indicating whether the phase leads or lags). That is, the output PLUPIDF of the selection signal 22 may be treated in the same way as a signal that adjusts the delay time of the variable delay circuit. Thus, the meaning of the output DCC of the duty change detection circuit 21 is the same as that of the output DLUPIF of the phase detector 14F. More specifically, the output DCC of the duty change detection circuit 21 being HIGH means that the duty of the DLL output signal is larger than 50%. The output DLUPIF of the phase detector 14F being HIGH indicates that the rise of the DLL output signal has a phase lag with respect to the rise of the external clock CK. The output DLUPIDF of the phase detector 14F is HIGH to control the counter via the Fall delay control circuit 15F without regard to which of the outputs DCC and DLUPIF has been selected. The variable delay circuit 12 and the variable delay circuit 10F thus perform control to quicken the fall timing, resulting in a smaller duty value.

In the configuration of FIG. 2, the selection circuit 22 is arranged, along with the duty change detection circuit 21, at the Fall side of the external clock. That is, phase adjustment (phase lock) with respect to the external clock is carried out on the Rise side and the duty change is carried out on the Fall side. It is however also possible to provide the selection circuit and the duty change detection circuit at the Rise side so that the phase adjustment (phase lock) with respect to the external clock is carried out on the Fall side and the duty change is carried out on the Rise side. The duty change detection circuit 21 may be arranged on each of the Rise and Fall sides.

An example application of the present invention will now be described. It is supposed that, in the present exemplary embodiment, an external signal (CK) (duty value=55%) has been received and the duty of the signal of an external interface (I/F) of a memory is to be 55%. In the conventional duty detection circuit, the duty value is corrected to 50% (the DLL output is also of the duty value of 50%).

According to the present invention, the duty value of the duty control signal is set to 50%−(duty value of the external signal *CK*−50%)= 50%−(55%−50%)

that is, to 45%.

The duty change circuit 101 generates DCC_CLKF_N/P and DCC_CLKR_N/P, with the duty value of 45%. The so generated signals are then output to the duty detection circuit 102.

The duty detection circuit 102, which detects the duty with a duty value=50% as a target, compares DCC_DBR and DCC_DBF to latch and output the result of comparison of −5%. The Fall delay control circuit (Fall Control) 15F controls the variable delay circuits 12 and 10F to make correction of −5%. As a result, the synthesis circuit 13, as an output of the DLL circuit, supplies an output with the duty ratio of 55%. By the operation of these component circuits, the duty detection circuit 102 recognizes the DLL output signal with the duty value of 55%, output from the synthesis circuit 13, as being of the duty value of 50%, due to the offset value (−5%) of the duty control signal supplied to the duty change circuit 101. Hence, the DLL output signal is supplied with the duty value of 55%. This DLL output signal provides for coincidence of the duty of the signal of the external interface (I/F) of the memory with the duty value of the external signal (CK).

It should be noted that the control of the duty value of the present invention is based on setting the duty value of 50% to a reference duty value without dependency upon the external signal.

The user has to set a duty correction value (offset value) of a duty control signal beforehand on e.g. a mode register (1-5 of FIG. 1). An I/O interface of a memory device of a user's system then operates with a DLL output of the duty value of 55%.

Also, if, at the time of test by a memory vendor, the duty control signal (see FIG. 4) is made variable, it is possible to correct fabrication-related variations in characteristics with respect to the external signal of the duty detection circuit. In this case, the correction values are stored in a ROM and the like within a memory device, for example.

If, in the present exemplary embodiment, the signal of the external interface (I/F) of a memory is of a duty value of 55%, without dependency upon the duty of the external signal (CK), and the duty correction value of the duty control signal is set to 45%, the DLL output is of the duty value of 55%. The I/O interface of the memory device then operates at a duty value of 55%.

A further example application of the present invention is then described.

The present invention also solves the problem of signal transmission lines between a memory controller for a memory system or a memory module and a memory device. For example, there may be a case where a user device is supposed to output an external signal (duty value=60%), while an external signal with a duty value of 55% is received at an input terminal of a memory device (at an external memory terminal) on the user's system. That is, the external signal (CK) with the duty value of 55% is received at the external terminal of the memory device, and the duty value of the signal output from the external interface (I/F) of the memory device is set to 60%. This case is equivalent to a case where the duty detection circuit 102 of the memory device directly outputs the duty value (55%) of the external signal as the DLL's duty.

This may be solved by setting the duty control signal of the duty change circuit 101 to 55%. By so doing, the DLL output in the memory device is of the duty value of 60%. That is, the signal at the I/O interface of the memory device is of the duty value of 60%, thus enabling matching to a duty value of 60% expected by a memory controller of the memory system.

The duty correction value (offset value) may be stored in a mode register provided in the memory device, for example, and register values may be instructed by a memory controller. By so doing, such a memory system or memory module may be implemented in which it is possible to overcome the aforementioned problems of the signal transmission path. If the memory system or the memory module is provided with a plurality of memory devices, it is of course possible to change the mode register value from one of the memory devices provided on the signal transmission path to another to individually set the duty correction values (offset values).

With the present exemplary embodiment, described above, it is unnecessary to provide two routes, namely a feedback route for the variable delay line (VDL) and a feedback loop for the duty detection and correction circuit (CDC), thus dispensing with redundant circuitry and preventing the circuit size from increasing.

Although the present invention has so far been described with reference to preferred embodiments, the present invention is not to be restricted to the embodiments. It is to be appreciated that those skilled in the art can change or modify the embodiments, based on the total disclosure inclusive of the claims and the technical concept, without departing from the spirit and the scope of the present invention.

For example, the four signals (DCC_CLKF_N, DCC_CLKF_P, DCC_CLKR_N and DCC_CLKR_P, output from the duty change circuit 101 (FIG. 4), may simply be replaced by two signals (DCC_CLKF_NP and DCC_CLKR_NP).

For example, the above four signals may be simplified to the above two signals by using a logic in which the bias voltage DCC_BIAS is also synchronized with the pre-charging signal DCC_PREB. In this case, NAND1, NAND2, NOR1, NOR2 or INV3 to 6 in the duty change circuit 101 (FIG. 4) may be dispensed with.

In addition, the pre-stage of the duty detection circuit 102 (FIG. 5) may be provided only with one of the PMOS transistors PM31 and the NMOS transistors NM31.

The disclosures of the aforementioned Patent Documents are incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

In the above exemplary embodiment, the present invention has been applied to a memory device. However, the present invention may also be broadly applied to devices encompassing DLL circuits included in semiconductor devices, such as CPUs, MCUs or DSPs. The present invention may also be applied to semiconductor devices carrying thereon DLL circuits provided that those semiconductor devices are included in SOCs (System-On-Chips), MCPs (Multi-Chip Packages) or POPs (Package-On-Packages). Moreover, the system that uses the devices may benefit from using the present invention.

The transistors are not limited to MOS transistors, but may also be applied to other sorts of FETs (Field-Effect Transistors), such as MIS (Metal-Insulator Semiconductor) or TFT (Thin-Film Transistor). The transistors may also be bipolar transistors. It is observed that the PMOS transistor (P-channel MOS transistor) is a representative example of a transistor of a first conductivity type and the NMOS transistor (N-channel MOS transistor) is a representative example of a transistor of a second conductivity type.

Figure 9:
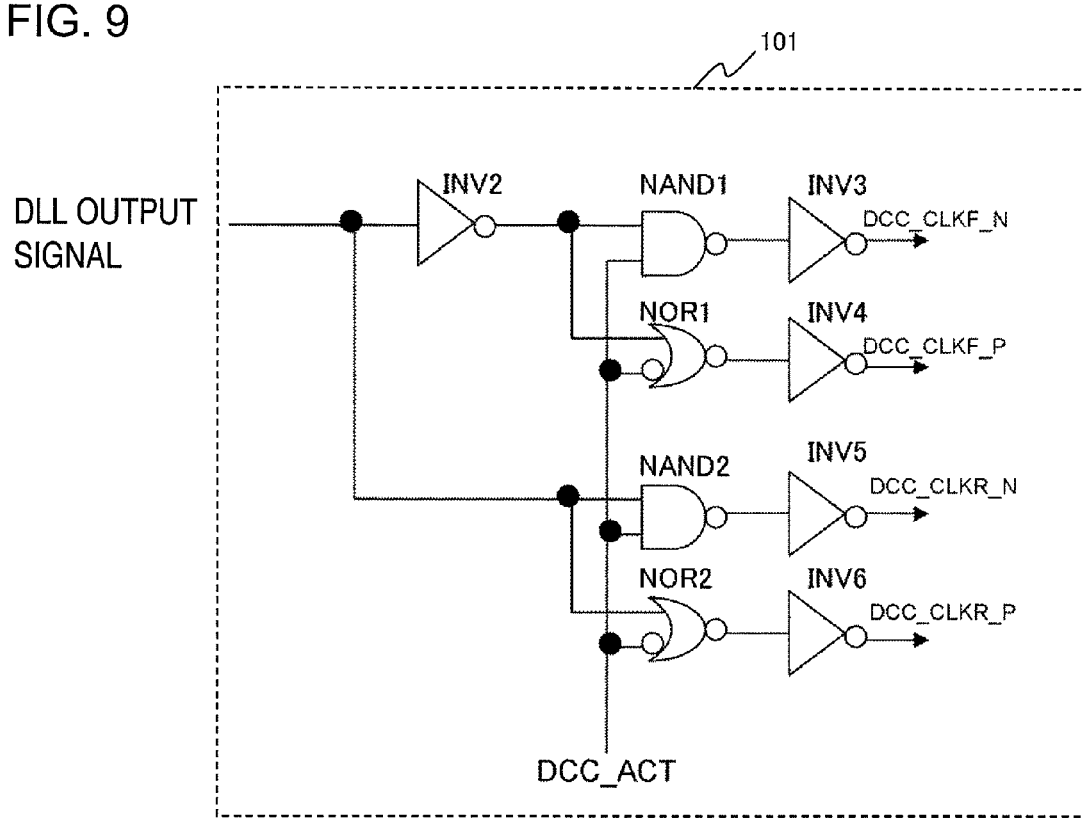
FIG. 9 is a diagram showing a configuration of a duty change detection circuit according to another exemplary embodiment of the present invention.

Another exemplary embodiment will now be described. FIG. 9 is a diagram showing the configuration of a duty change circuit (101 in FIG. 3) of the duty change and detection circuit (DCC).

Referring to FIG. 9, the duty change circuit according to the present exemplary embodiment is composed of the right half part circuit of the duty change circuit in FIG. 4 with the left half part of the duty change circuit in FIG. 4 being omitted. As shown in FIG. 9, a DLL output signal is supplied to an inverter INV2, DCC_CLKF_N is generated from a circuit inclusive of a NAND circuit NAND1 and an inverter INV3, and DCC_CLKF_P is generated from a circuit inclusive of a NOR circuit NOR1 and an inverter INV4. The DLL output signal is also supplied to an input of a NAND circuit NAND2 and to an input of NOR circuit NOR 2. DCC_CLKR_N is generated from an inverter INV5 which receives an output of NAND2 and DCC_CLKR_P is generated from an inverter INV6 which receives an output of NOR2. When DCC_ACT is Low, DCC_CLKF_N and DCC_CLKR_N are fixed to Low and DCC_CLKF_P and DCC_CLKR_P are fixed to High.

When DCC_ACT is High, DCC_CLKR_P and DCC_CLKR_N rise and fall in synchronization with a rising edge and a falling edge of the DLL output signal, respectively. DCC_CLKR_P and DCC_CLKR_N have pulse waveforms each having a High period (pulse width) corresponding to a High period of the DLL output signal (output clock) (see FIG. 7(*c*)). When DCC_ACT is High, DCC_CLKF_P and DCC_CLKF_N rise and fall in synchronization with a falling edge and a rising edge of the DLL output signal, respectively. DCC_CLKF_P and DCC_CLKF_N have pulse waveforms each having a High period (pulse width) corresponding to a Low period of the DLL output signal (output clock) (see FIG. 7(*b*)).

Figure 10:
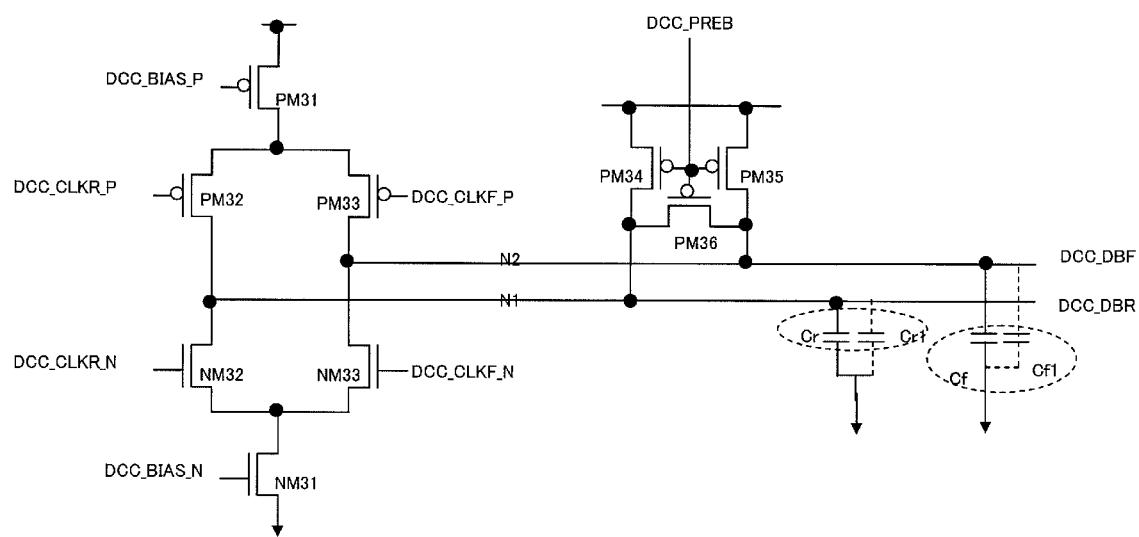
FIG. 10 is a diagram showing a configuration of a duty change detection circuit according to another exemplary embodiment of the present invention.

FIG. 10 is a diagram showing the configuration of the duty detection circuit (102 of FIG. 3) according to the present exemplary embodiment. In the present exemplary embodiment, in the duty detection circuit, a capacitance value (or size) of a capacitor used for duty detection is changed to make it possible to change the duty of the DLL output signal.

Referring to FIG. 10, the duty detection circuit according to the present exemplary embodiment includes an NMOS transistor NM32 (first discharging element) which is made conductive during a High period of DCC_CLKR_N to discharge a node DCC_DBR that has been reset to a power supply voltage VDD to a GND side;

an NMOS transistor NM33 (second discharging element) which is made conductive during a High period of DCC_CLKF_N which is reverse phased with respect to the DLL output signal to discharge a node DCC_DBF that has been reset to the power supply voltage VDD to a GND side, capacitors Cr and Cr1 whose capacitance values are such that Cr>Cr1 and connected to the node DCC_DBR; and capacitors Cf and Crf whose capacitance values are such that Cf>Cf1 and connected to the node DCC_DBR.

By changing the capacitance values of capacitors connected to the node DCC_DBR and capacitors connected to the node DCC_DBF, it is made possible to change the duty of the DLL output signal.

The duty detection circuit also includes a PMOS transistor PM32 (first charging circuit) which is made conductive during a Low period of DCC_CLKR_P which is in phase with respect to the DLL output signal to charge a node DCC_DBR from a power supply side that has been reset to a power supply voltage VDD to a GND side; and a PMOS transistor PM33 (second charging circuit) which is made conductive during a Low period of DCC_CLKF_P which is reversed phased to the DLL output to charge a node DCC_DBF.

In case the duty of the signal DCC_CLKR_P which is in phase with the DLL output signal is less than 50%, the capacitor CR and Cr1 are connected to the node DCC_DBR in order to retard a falling edge of a High pulse of DCC_CLKR_N which is in phase with the DLL output signal.

In the present exemplary embodiment, the capacitors Cr, Cr1, Cf and Cf1 are each composed of a MOS capacitor.

In FIG. 10, MOS transistors NM31 and PM31 which receive at respective gates bias voltages DCC_BIAS_N and DCC_BIAS_P supplied from a control circuit (103 in FIG. 3), and PMOS transistors PM34 to PM36 which receive at gates a pre-charge signal DCC_PREB and made conductive with DCC_PREB High to reset and equalize nodes DCC_DBR and DCC_DBF to a power supply voltage are the same as the corresponding transistors in FIG. 5, and hence the explanation thereof is omitted.

With the exemplary embodiment shown in FIG. 4 and FIG. 5, the signal to be supplied to the duty detection circuit 102 is adjusted in the duty change circuit 101. The present exemplary embodiment is different from the exemplary embodiment shown in FIG. 4 and FIG. 5, in that in the duty change detection circuit (DCC), as shown in FIG. 9 and FIG. 10, the capacitance value of the capacitor used for duty detection (recognition) of the DLL output signal is changed to perform the duty change and adjustment.

The duty change detection circuit (DCC) that change the capacitance will now be described. As described above, DCC adjust the duty of the DLL output signal. Assuming that the adjusted duty of the DLL output signal is 50%, the duty may take a value other than 50% due to various types of variations.

FIGS. 11 to 14 are diagrams for explaining the operation of a DCC utilizing a MOS capacitor which is in wide use in a DLL.

Figure 11:
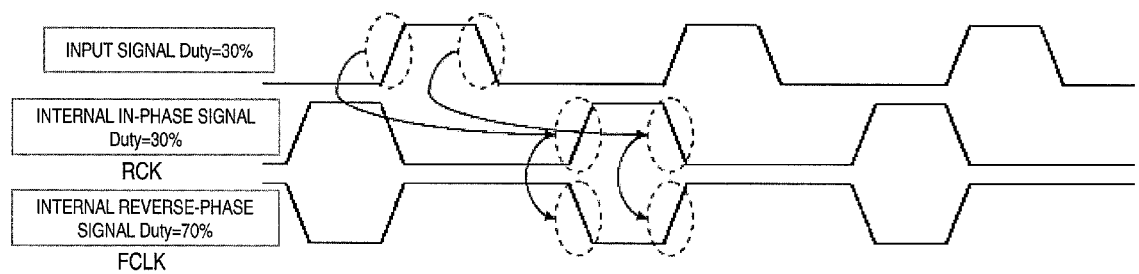
FIG. 11 is a waveform diagram showing the relation of an input signal, internal in-phase signal and internal reverse-phase signal in an unadjusted state.
Figure 14:
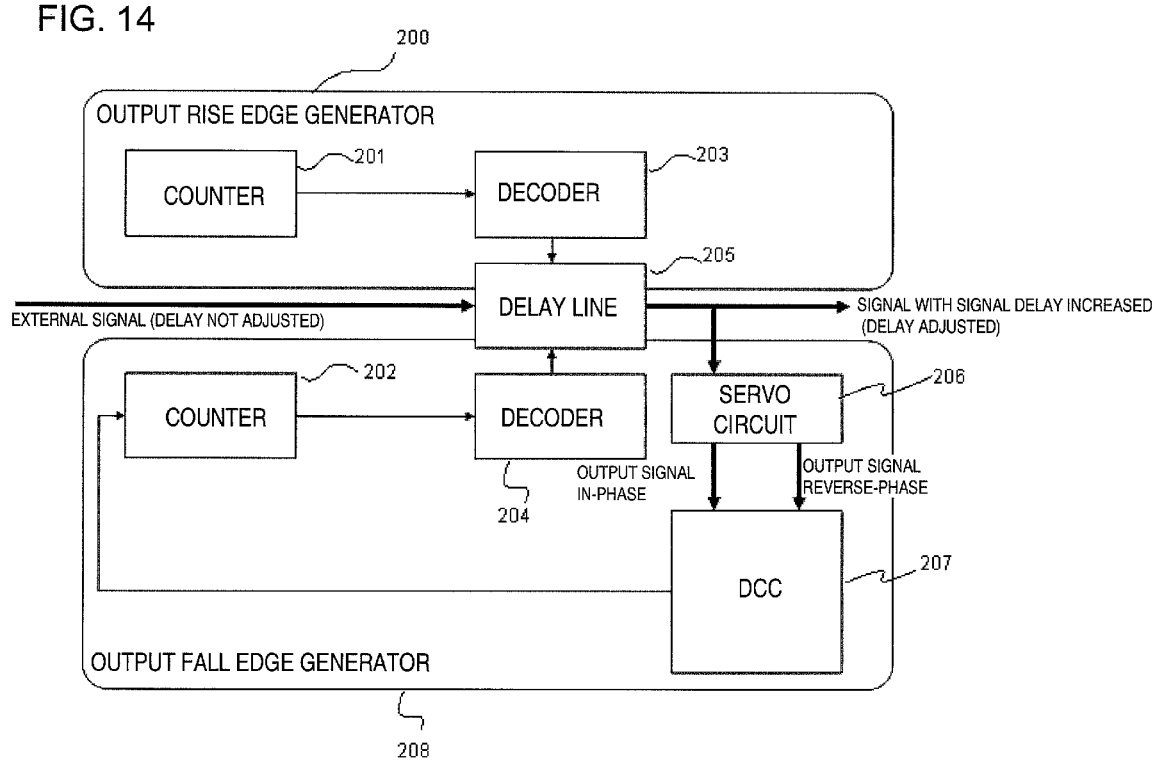
FIG. 14 is a schematic block diagram showing a configuration of a DLL with a DCC.

In FIG. 11, the duty of an input signal is not 50% (30%). In a servo circuit provided in a preceding stage of the DCC, an internal in-phase signal (RCLK) and an internal reverse-phase signal (FCLK) are generated. FIG. 14 shows schematically the entire configuration of the DCC and DLL. The duty of the internal in-phase signal (RCLK) is 30%. The duty of the internal reverse-phase signal (FCLK) is 70% which is reversed with respect to the duty of the internal in-phase signal (RCLK). (70%=100%−30%)

Figure 12:
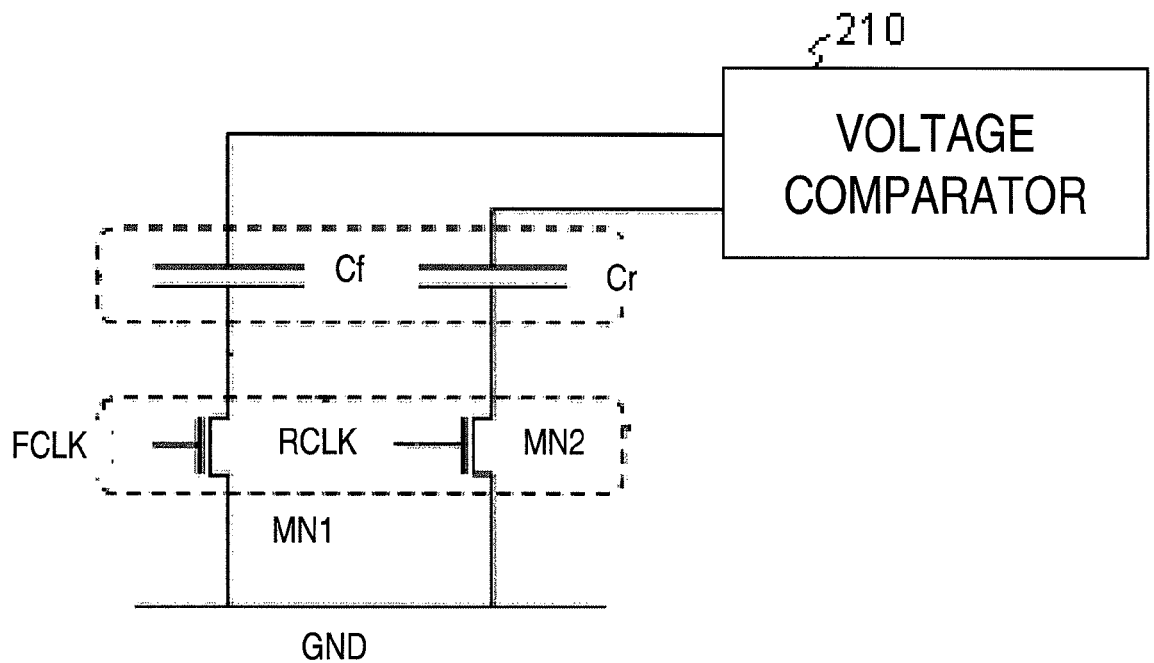
FIG. 12 is a diagram showing a configuration of a discharging circuit and a voltage comparator.

In FIG. 12, capacitors Cr and Cf which have been pre-charged to have the same terminal voltage are provided for RCLK and FCLK, respectively. It is observed that as capacitors in a semiconductor device, MOS capacitors are generally utilized. MOS capacitors Cr and Cf pre-charged to the same voltage are discharged when RCLK and FCLK are High, respectively, and the terminal voltages of Cr and Cf drop in accordance with the time width of High period (that is, duty) of RCLK and FCLK, respectively. The voltage comparator 210 compares the terminal voltages of Cr and Cf after the voltage drop thereof to make it possible to compare the duties of RCLK and FCLK. The terminal voltage corresponding to a signal having a longer High period takes lower voltage.

A counter 201 or 202 in FIG. 14 is adjusted in order to elongate the duty of RCLK or FCLK which has been detected to be lower in voltage by the voltage comparator 210. As a result, the duty of the DLL output signal is continually adjusted to be around 50%. The fall edge of one of RCLK and FCLK which has smaller duty is delayed to make the duty of the DLL output signal come close to 50%. The counter 201 in an output signal rise edge generator 200 corresponds to a rise counter 16R in FIG. 2, while the counter 208 in an output signal fall edge generator 208 corresponds to a fall counter 16F in FIG. 2.

Figure 13:
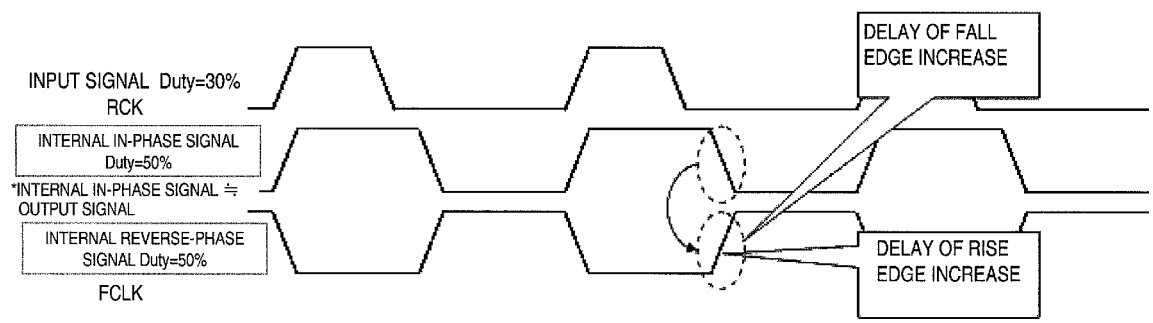
FIG. 13 is a diagram showing an example of duty correction with edge adjustment of an internal signal in an adjusted state.

In FIG. 13, the delay of the fall edge of RCLK (internal in-phase clock) is increased, based on the result of comparison by the voltage comparator 210, and hence the delay of the rise edge of FCLK (internal reverse-phase clock) is increased. The waveform of RCLK (internal in-phase clock) is almost equal to that of the DLL output signal. As a result of the duty adjustment above described, the duty of the DLL output signal becomes 50%. After the duty of the DLL output signal has become 50%, when the duty of RCLK exceeds 50%, the delay of the fall edge of RCLK is decreased, as a result of which the duty of RCLK is continually adjusted to keep 50%.

In the DLL with DCC, the rise edge side counter 201 and fall edge side counter 202 are independent. DCC 207 monitors in-phase and reverse signals of the output signal (almost equal to internal in-phase signal) output from a delay line 205. The in-phase and reverse signals of the output signal are generated in a servo circuit 206. The counter 202 of the output signal fall edge generator 208 is controlled by an output signal of the DCC 207 to make adjustment such that the fall edge of the output signal (delay increased signal) is positioned at the center of one cycle of the output signal (duty=50%). It is seen that the accuracy of signal correction of the MOS capacitor type DCC is dependent on the following points:
(a) fair comparison of the voltages Vf and Vr compared to each other by the voltage comparator 210 being possible.
(b) degree of coincidence (or equivalence) of characteristics of charged capacitors between RCLK and FCLK.
(c) the duty of the signal supplied to DCC being equal to that of the DLL output signal.

If the above three points (a) to (c) are not met, the duty of the output signal deviates from 50%. The following are examples of problems that are deterrent to accomplishment of the above three points:
(a) The analog characteristic of the voltage comparator 210 is such that one of two signals being compared to each other is detected to be higher than its real value. The fact that the voltage comparator 201 is formed by an analog circuit is the cause. An analog circuit is susceptible to variations at the time of semiconductor fabrication processes. This leads to certain variations between different samples.
(b) The time constant of a signal path from the MOS capacitor to the voltage comparator 210 within the DCC for RCLK differs from that for FCLK. The capacitor size for RCLK differs from that for FCLK. Such case may be presented in case the capacitance for RCLK differs from that for FCLK due to spatial film thickness variations produced in fabrication of the semiconductor.
(c) The duty of an input signal to the DCC differs from that of a pre-correction DLL signal output. It is assumed that, before DCC correction, the duty of the input signal to the DCC is 43%, and that the duty of the DLL output signal is 45%. As a result of adjustment to 50% by the DCC (+7 points), the duty of the output signal is 52% (+7 points).

Figure 16:
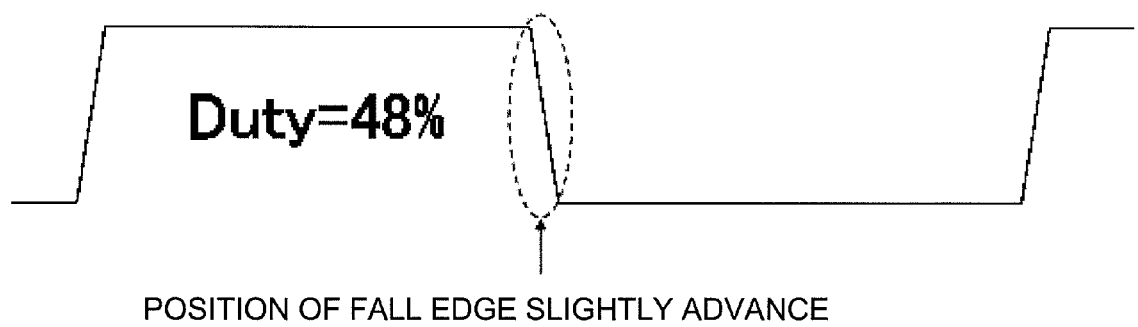
FIG. 16 shows a waveform of a signal having a duty different from 50% after being subjected to the duty adjustment by DCC.

As shown in FIG. 16, assume that with the duty adjustment by DCC, the duty of the output signal becomes 48% for example, different from 50%. In this case, with the present exemplary embodiment, the fall edge timing of RCLK (internal in-phase signal) is intentionally delayed to adjust the duty of the output signal.

Figure 17:
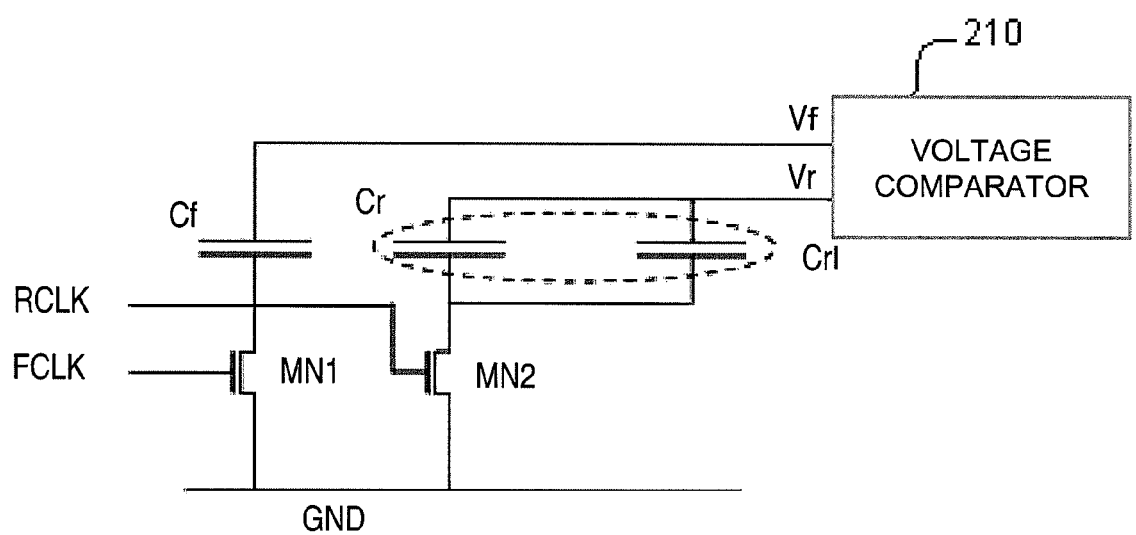
FIG. 17 is a schematic diagram for explaining the correction of voltage comparison by Cr1.

According to the present invention, as shown schematically in FIG. 17, the capacitance value of Cr on RCLK side node Vr is changed to take the increased capacitance value of Cr plus Cr1, while the capacitance value of Cf on FCLK side node Vf is kept unchanged. As a result, the ratio of RCLK and FCLK when the voltages Vf and Vr supplied to the voltage comparator 201 become equal is changed. The ratio of RCLK and FCLK is a ratio of time width of High period of RCLK and FCLK. In the example of FIG. 17, if the time width of the High period of RCLK is elongated a little, then Vr=Vr.

In the present exemplary embodiment, as shown in FIG. 10, and FIG. 17, an unused MOS capacitor Cr1 is prepared for Cr and the application of the unused Cr1 is decided in accordance with the condition of the duty. There is also prepared Cf1 for Cf. Now, such a case is considered in which the duty of the output signal deviates to 52% (a rise edge of the RCLK advances a little), for example, different from 50%. In this case, the capacitor on the FCLK side node Vf is changed from Cf to Cf plus Cf1, while the capacitor on the RCLK side node Vr is kept unchanged. As a result, the ratio of the time widths of High periods of RCLK and FCLK at which it is decided that Vf=Vr in the voltage comparator 210 is changed. That is, if the High period is slightly elongated (therefore, the High period of RCLK is shortened), then Vf=Vr.

Figure 18:
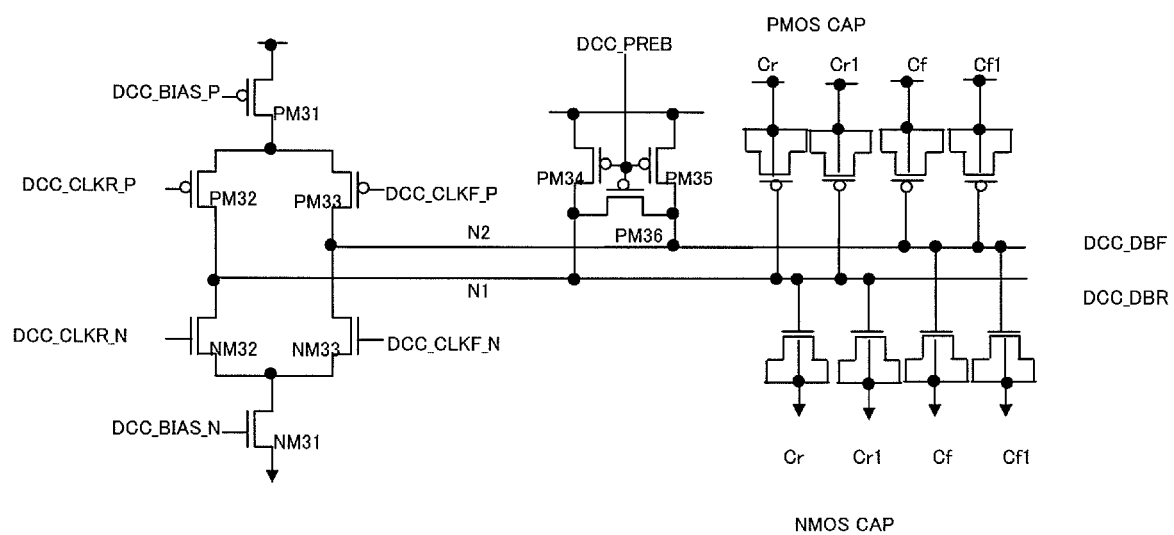
FIG. 18 is a diagram showing a configuration of a duty change detection circuit using MOS capacitors.

FIG. 18 is a diagram showing a circuit configuration in which the present embodiment is applied to the duty detection circuit shown in FIG. 5. Referring to FIG. 18, capacitors Cr (P-channel MOS capacitor and N-channel MOS capacitor) and capacitors Cr1 (P-channel MOS capacitor and N-channel MOS capacitor) are connected to the node DCC_DBR in FIG. 5. Capacitors Cf (P-channel MOS capacitor and N-channel MOS capacitor) and capacitors Cf1 (P-channel MOS capacitor and N-channel MOS capacitor) are connected to the node DCC_DBF in FIG. 5. Each MOS capacitor has a gate connected to the node DCC_DBR or DCC_DBF and has a drain terminal, a source terminal and a substrate terminal (backgate terminal) (Sub) coupled together. P-channel and N-channel MOS capacitors, each constituting Cr1 (auxiliary capacitor) are smaller in size than P-channel and N-channel MOS capacitors, each constituting Cr. P-channel and N-channel MOS capacitors, each constituting Cf1 (auxiliary capacitor) are smaller in size than P-channel and N-channel MOS capacitors, each constituting Cf.

When the MOS capacitor Cr1 is not applied, the voltages at respective nodes are shown in upper half rows designated by "not applied". The substrate terminal (Sub), source terminal and drain terminal of the P-channel MOS capacitor Cr are all High, while the substrate terminal (Sub), source terminal and drain terminal of the P-channel MOS capacitor Cr1 are all Low. The substrate terminal (Sub), source terminal and drain terminal of the P-channel MOS capacitor Cf are all High, while the substrate terminal (Sub), source terminal and drain terminal of the P-channel MOS capacitor Cf1 are all Low. The substrate terminal (Sub), source terminal and drain terminal of the N-channel MOS capacitor Cr are all Low, while the substrate terminal (Sub), source terminal and drain terminal of the N-channel MOS capacitor Cr1 are all High. The substrate terminal (Sub), source terminal and drain terminal of the N-channel MOS capacitor Cf are all Low, while the substrate terminal (Sub), source terminal and drain terminal of the P-channel MOS capacitor Cf1 are all Low. Respective terminal voltages of the MOS capacitor are supplied from the control circuit 103 in FIG. 3, for example.

In the auxiliary MOS capacitor Cr1, the respective terminal voltages of P-channel and N-channel MOS capacitors are set to Low and High, respectively. This voltage setting is different from the normal setting in which the respective terminal voltages of P-channel and N-channel MOS capacitors are set to High and Low, respectively. Owing to the above mentioned voltage setting of Cr1, the capacitance value of Cr1 decreases. Regarding Cf1, the respective terminal voltages of P-channel and N-channel MOS capacitors are set to Low and High, respectively, as with Cr1, thereby decreasing the capacitance value of Cf1.

When the auxiliary MOS capacitor Cr1 is applied and connected to the node DCC_DBR, the voltages at respective nodes are shown in lower half rows indicated by "applied". The substrate terminal (Sub), source terminal and drain terminal of the P-channel MOS capacitor Cr1 are changed from Low to High, while the substrate terminal (Sub), source terminal and drain terminal of the N-channel MOS capacitor Cr1 are changed from High to Low.

As shown in FIG. 18, MOS capacitors Cr and Cr1 are connected in parallel, the capacitance value attached to the node DCC_DBR, is increased by the applied Cr1. On the other hand, since the connection of Cf1 to DCC_DBF is not applied, the capacitance value attached to the node DCC_DBF is Cf.

If the voltage Vr should be equivalent to the voltage Vf, the time width of High period of RCLK must be elongated. That is, the delay of the fall edge of RCLK must be increased. Therefore, the counter 201 in FIG. 14 continues to perform count operation until the elongation of the time width of High period of RCLK is attained.

The extension of the time width of High period of RCLK means the reduction of the time width of High period of FCLK. In performing this operation, if the position of the rise edge of RCLK is unchanged, the fall edge of FCLK is delayed. Since the rise edge of FCLK corresponds to the fall edge of the DLL output signal, the fall edge of the DLL output signal is delayed in timing, thereby correcting the duty of the DLL output signal.

The nodes DCC_DBR and DCC_DBF are input to the differential circuit (decision circuit) in FIG. 6 and latched by the latch circuit (Latch) in FIG. 6. The differential circuit (decision circuit) in FIG. 6 corresponds to the voltage comparator 210 in FIGS. 12 and 17.

The variation of the present exemplary embodiment will now be described. In the examples described with reference to FIG. 10 and FIG. 18, there are provided MOS capacitors (Cr and Cf) for electric charge accumulation and MOS capacitors (Cr1 and Cf1) for correction. In this variation example, the combination of large and small MOS capacitors are extended such that there are provided eight sorts of MOS capacitors with respective areas different to each other.

Figure 19:
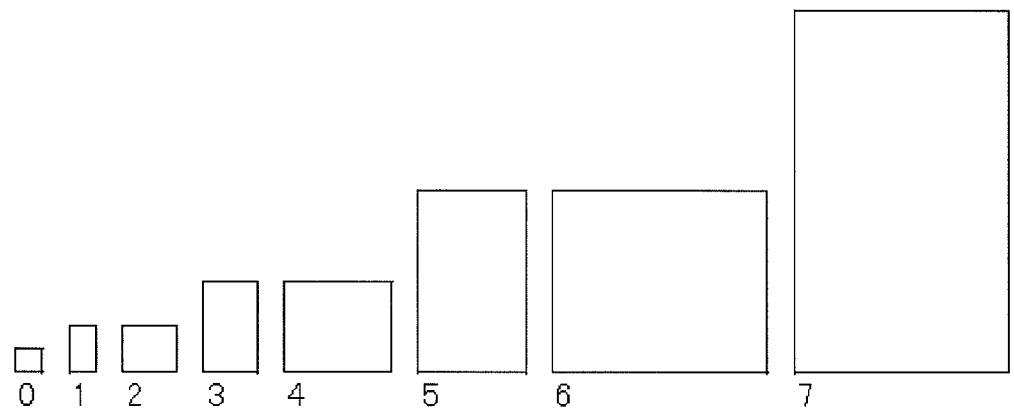
FIG. 19 is a top plan view of MOS capacitors with eight sorts of areas.

FIG. 19 shows a top plan view of the gate parts of these MOS capacitors. The eight sorts of the MOS capacitors are obtained on varying the area by a factor of two in a direction from the smallest MOS capacitor towards a neighboring second smallest MOS capacitor, larger than the smallest MOS capacitor, then towards a neighboring still larger MOS capacitor, and so forth. It is thus possible to change the accumulation charge values in 256 stages based on the difference in the combinations of the MOS capacitors. Further finer adjustment is also possible if the source-to-drain potential may be sub-divided with respect to the sub-potential. If the 127th and 128th values are set to standard values, the maximum value of the charges may be extended to twice the standard value, while there is left much tolerance to cope with reduction to smaller capacitances. Meanwhile, with the actual product (DDR2/DDR3-SDRAM), the MOS capacitor for DCC is of a size of the order of 4 µm by 4 µm. That is, under the current minimum process rule (Wmin=1 µm/Lmin=60 nm or thereabouts, where W is a gate width and L is a gate length), the minimum MOS capacitor size may be of a size about less than 0.5% of 4 µm by 4 µm, such that variations for fine adjustment may finely be adjusted.

For further finer adjustment, it is effective to increase the size of the MOS capacitor as base. If the base MOS capacitor is enlarged, the relative capacitance of the MOS capacitor for adjustment may be reduced to further reduce the variation steps.

For coping with enlargement of the capacitance-component in its entirety, unless other elements are changed, the discharging time is increased with increase in the capacitance-component. Hence, the gate width W of NMOS transistors (MN1 and NM2 in FIG. 17) is enlarged with increase in the C-component. With increase in the W-size, the discharge current increases to expedite potential drop.

As an example, the present invention may be applied to a semiconductor device testing. On a tester such as a memory tester, a test program is executed for testing semiconductor devices under test (for example, be a product DDR3-DRAM carrying thereon a DLL provided with DCC). Duty check is carried out during the device testing.

For example, if the duty obtained by the duty check is 48%, the duty may approach to 50% by increasing a capacitance value of a MOS capacitor (for example, attachment of Cr1). In case the production of semiconductor devices are carried out with qualities of devices not yes being stabilized, the duty of the DLL output signal which have been adjusted by DCC still tends to deviate from the desired value. Even if the DCC circuit operates properly to adjust the duty of the DLL output signal, there may be a case that the duty of the DLL output signal subjected to duty adjustment takes a value other than 50%, due to the problem such as the above described points (a), (b) and (c), for example. When such a case happens in volume production, the duty of the DLL output signal subjected to duty adjustment takes a different by each chip. The intrinsic duty values or variations of the DLL output signal subjected to duty adjustment increases with the increase of the chip production number (the deviation of duty among chips becomes larger). As a result, the unification of the product quality becomes difficult with the increase of production number. To cope with this, the present invention is applied to correct externally and the duty of a chip after production, thereby reducing the deviation of the duty among chips and promoting the unification of product quality.

In the present example, capacitance components are formed on a semiconductor device by combining plural different sizes of MOS capacitors as shown in FIG. 19. In the present example, by taking a wide adjustment range in design of the semiconductor device, a large variety of duty values, predicted in volume production, may successfully be coped with. In the present example, the duty adjustment is carried out by changing a capacitor size.

DCC is originally adapted to set the duty of an output signal to 50%, as mentioned above, the duty may take value different from 50% due to the fabrication process variations, for example. In the present exemplary embodiment, in adjusting the duty of a DLL output signal, the size of a MOS capacitor used for duty detection is changed to change the duty of the output signal.

In the exemplary embodiment described with reference to FIG. 17, the duty of the output signal is controlled to be 50% by adjusting the size of capacitors (Cf, Cr+Cr1) for duty detection so that the voltage of Vr becomes equal to that of Vf in the voltage comparator 210. It is as a matter of course that the present invention is not limited to adjusting the duty to 50%. When the capacitance value for duty detection is set so that the ratio of Vf and Vr is set to a prescribed value other than 1:1 in the voltage comparator 210, the duty of the output signal is able to be set to a prescribed value other than 50% by a feedback control of the DLL.

Although the present invention has so far been described with reference to preferred embodiments, the present invention is not to be restricted to the embodiments. It is to be appreciated that those skilled in the art can change or modify the embodiments, based on the total disclosure inclusive of the claims and the technical concept, without departing from the spirit and the scope of the present invention.

What is claimed is:

1. A DLL (delay locked loop) circuit comprising:
a first variable delay circuit variably delaying a first transition of an external signal to output a resulting output signal;
a second variable delay circuit variably delaying a second transition of the external signal to output a resulting output signal;
a synthesis circuit synthesizing the output signal of the first variable delay circuit and the output signal of the second variable delay circuit to output a synthesis signal;
an offset control circuit producing an offset data independently of the synthesis circuit;
a duty change detection circuit responding to the synthesis signal and the offset data and producing an output signal that is different in duty from the syntheses signal; and
a delay control circuit changing at least one of a delay of the first variable delay circuit and a delay of the second variable delay circuit in response to the output signal.

2. The DLL circuit according to claim 1, wherein the offset control circuit receives a duty control signal that relating the offset data,
the synthesis signal includes a duty that relevant to offset data, and
the output signal of duty change detection circuit shows whether the synthesis signal is predetermined duty.

3. The DLL circuit according to claim 1, the duty change detection circuit further comprising a duty change circuit and a duty detection circuit, wherein,
the duty change circuit receives the synthesis signal,
the duty detection circuit receives an output signal of the duty change circuit, and
the offset control circuit produces the offset data to the duty change circuit.

4. The DLL circuit according to claim 1, wherein
the offset control circuit controlling a rising waveform and a falling waveform of the synthesis signal.

5. The DLL circuit according to claim 1, further comprising:
a phase detection circuit detecting a phase difference between the external signal and an output signal of the synthesis circuit; and
a selection circuit that receives an output signal of the duty change detection circuit and an output signal of the phase detection circuit to select and output one of the received signals, an output of the selection circuit being supplied to the delay control circuit.

6. A DLL circuit comprising:
a delay line receiving an external signal, the delay line variably setting a delay time with a prescribed delay time unit, based on a selection control signal which controls a delay of the external signal, the delay line producing a first set of first and second delay signals having different delay time values in association with a first transition of the external signal, the delay line producing a second set of first and second delay signals having different delay time values in association with a second transition of the external signal;
a first interpolator provided in association with the first set of the first and second delay signals associated with the first transition of the external signal, the first interpolator receiving the first set of the first and second delay signals to output a third delay signal, a delay of the third delay signal being set with a higher resolution than the prescribed delay time unit;
a second interpolator provided in association with the second set of the first and second delay signals associated with the second transition of the external signal, the second interpolator receiving the second set of the first and second delay signals to output a fourth delay signal, a delay of the fourth delay signal being set with a higher resolution than the prescribed delay time unit;
a synthesis circuit receiving the third and fourth delay signals output respectively from the first and second interpolators to produce a synthesized output signal, based on the third and fourth delay signals received;
a duty change detection circuit including a duty change circuit and a duty detection circuit,
the duty change circuit receiving the synthesized output signal from the synthesis circuit to produce a signal obtained by changing a duty of the output signal of the synthesis circuit in accordance with a duty control signal supplied thereto, the duty being a ratio of HIGH and LOW level periods in one cycle of the output signal of the synthesis circuit,
the duty detection circuit detecting the duty which is variably controlled by the duty change circuit to output a duty detection result signal including a value indicating whether the duty detected is larger or smaller than a prescribed duty value;
a selection circuit receiving the duty detection result signal from the duty change detection circuit and a phase comparison result signal from a phase detector that compares the phase of the synthesized output signal from the synthesis circuit and the phase of the external signal to each other, the selection circuit selecting one of the signals received; and a delay control circuit variably controlling the delay of the delay line and/or the delay of the interpolator corresponding to at least one of the first and second transitions of the external signal, based on an output of the selection circuit.

7. The DLL circuit according to claim 6, wherein the duty change circuit includes:

first and second transistors connected in series with each other between first and second power supplies;

a first charging/ discharging circuit that charges or discharges a gate of the first transistor in response to the output signal of the synthesis circuit; and a second charging/ discharging circuit that charges or discharges a gate of the second transistor in response to the output signal of the synthesis circuit;

the duty change circuit variably controlling at least one of the charging or discharging current of the first charging/ discharging circuit and the charging or discharging current of the second charging/ discharging circuit.

8. The DLL circuit according to claim 7, wherein the first charging/discharging circuit includes:

a third transistor connected between the first power supply and the gate of the first transistor;

fourth and fifth transistors connected in series between the gate of the first transistor and the second power supply; and a sixth transistor connected between a connection node of the fourth and fifth transistors and the second power supply or a plurality of sixth transistors connected in parallel with one another between the connection of the fourth and fifth transistors and the second power supply, each of the sixth transistors being controlled so as to be conductive or non-conductive based on the associated duty control signal;

the output of the synthesis circuit being directly or indirectly supplied in common to control terminals of the third to fifth transistors, and wherein the second charging/ discharging circuit including:

a seventh transistor connected between the second power supply and the gate of the second transistor;

eighth and ninth transistors connected in series between the gate of the second transistor and the first power supply; and a tenth transistor connected between a connection of the eighth and ninth transistors and the second power supply, or a plurality of tenth transistors connected in parallel with one another between a connection of the eighth and ninth transistors and the second power supply, the plurality of tenth transistors connected in parallel with one another, each of the tenth transistors controlled so as to be conductive or not-conductive, based on the associated duty control signal;

an output of the synthesis circuit being directly or indirectly supplied in common to control terminals of the seventh to ninth transistors.

9. The DLL circuit according to claim 7, wherein the duty change circuit includes a circuit that generates a first signal and a second signal from a signal at a connection node of the first and second transistors, the second signal having a phase reversed with respect to the first signal.

10. The DLL circuit according to claim 9, wherein the duty detection circuit includes:

a first pair of transistors connected in series between the first and second power supplies, the first pair of transistor being of different conductivity types, the first pair of transistors having control terminals supplied with the first signal from the duty detection circuit;

a second pair of transistors connected in series between the first and second power supplies, the second pair of transistor being of different conductivity types, the second pair of transistors connected in parallel with the first pair of transistors between the first and second power supplies, the second pair of transistors having control terminals supplied with the second signal from the duty detection circuit; and a differential circuit differentially receiving and amplifying a voltage at a connection node of the series-connected transistors of the first pair and a voltage at a connection node of the series-connected transistors of the second pair, an output of the differential circuit being output as a duty detection result.

11. The DLL circuit according to claim 7, wherein the duty change circuit includes a circuit that, when a signal controlling an operation or a stop indicates the operation, outputs first and second signals in phase with each other from the connection node of the first and second transistors, and that, when the signal controlling the operation or the stop indicates the stop, sets the first and second signals to predetermined complementary values; and a circuit that, when the signal controlling an operation or a stop indicates the operation, outputs third and fourth signals having phases reversed with respect to the first and second signals from the connection node of the first and second transistors, and that, when the signal controlling the operation or the stop indicates the stop, sets the third and fourth signals to predetermined complementary values.

12. The DLL circuit according to claim 11, wherein the duty detection circuit includes:

a first pair of transistors connected in series between the first and second power supplies, the first pair of transistor being of different conductivity types, the first pair of transistors having control terminals supplied with the first and second signals from the duty detection circuit;

a second pair of transistors connected in series between the first and second power supplies, the second pair of transistor being of different conductivity types, the second pair of transistors connected in parallel with the first pair of transistors between the first and second power supplies, the second pair of transistors having control terminals supplied with the third and fourth signals from the duty detection circuit; and a differential circuit differentially receiving and amplifying a voltage at a connection node of the series-connected transistors of the first pair and a voltage at a connection node of the series-connected transistors of the second pair, an output of the differential circuit being output as a duty detection result.

13. The DLL circuit according to claim 10, wherein the duty detection circuit further includes at least one of a current source connected between the first power supply and a first connection node of the parallel connected first and second pairs of transistors, and a current source connected between the second power supply and a second connection node of the parallel connected first and second pairs of transistors, the current source being controlled by a bias voltage.

14. The DLL circuit according to claim 10, wherein the duty detection circuit further includes
a latch circuit that latches an output of the differential circuit based on a latch control signal, an output of the latch circuit being output as the duty detection result.

15. The DLL circuit according to claim 10, wherein the duty detection circuit further includes
a pre-reset circuit that, in response to a pre-reset controlling signal, sets the connection node of the series-connected transistors of the first pair and the connection node of the series-connected transistors of the second pair to a prescribed voltage.

16. The DLL circuit according to claim 12, wherein, if, in the duty detection circuit, the signal indicating the operation or the stop indicated the stop, the first pair of transistors are controlled to be non-conductive by the first and second signals from the duty change circuit and the second pair of transistors are controlled to be non-conductive by the third and fourth signals from the duty change circuit; the connection node of the series-connected transistors of the first pair and the connection node of the series-connected transistors of the second pair being controlled to be in floating states.

17. The DLL circuit according to claim 10, wherein, in the duty detection circuit, the differential circuit includes:
first and second inverters having inputs and outputs cross-coupled to each other;
first and second transistors connected between the first and second inverters and a power supply and having gates connected to the connection node of the series-connected transistors of the first pair and the connection node of the series-connected transistors of the second pair;
an output of one of the first and second inverters being connected directly or indirectly to the latch circuit.

18. The DLL circuit according to claim 17, comprising
a circuit that resets the output nodes of the first and second inverters to a prescribed voltage when the signal that controls the operation or the stop indicates the stop.

19. A semiconductor device comprising:
a memory cell array;
a memory control circuit having an access circuit that accesses the memory cell array; and
a DLL circuit that generates a timing clock for an input and/or an output of memory cell data by the memory control circuit; wherein
the DLL circuit is that according to claim 6.

20. A DLL (delay locked loop) circuit comprising:
a first variable delay circuit variably delaying a first transition of an external signal to output a resulting output signal;
a second variable delay circuit variably delaying a second transition of the external signal to output a resulting output signal;
a synthesis circuit receiving the output signal of the first variable delay circuit and the output signal of the second variable delay circuit to synthesize the received signals;
a duty change detection circuit including a duty detection circuit and a duty change circuit, wherein the duty detection circuit includes a capacitor discharged or charged based on an output signal of the synthesis circuit to detect a duty of the output signal of the synthesis circuit using the capacitor, and the duty change circuit changes the duty of the output signal of the synthesis circuit by changing a capacitance value of the capacitor included in the duty detection circuit, the duty being a ratio of a high level period and a low level period relative to one period of the output signal of the synthesis circuit; and a delay control circuit changing at least one of a delay of the first variable delay circuit and a delay of the second variable delay circuit in accordance with the result of duty detection of the duty change detection circuit.

21. The DLL circuit according to claim 20, wherein the duty detection circuit includes, as the capacitor for duty detection,
a first capacitor being subjected to charging or discharging, when an in-phase signal which is in-phase with the output signal of the synthesis circuit is active to have a terminal voltage thereof set to a voltage corresponding to a time width of an activation period of the in-phase signal; and
a second capacitor being subjected to charging or discharging, when a reverse-phase signal whose phase is reversed with respect to the output signal of the synthesis circuit is active to have a terminal voltage thereof set to a voltage corresponding to a time width of an activation period of the in-phase signal, wherein
in the duty detection circuit, the terminal voltage of the first capacitor and the terminal voltage of the second capacitor are compared to detect the duty of the output signal of the synthesis circuit, and the duty of the output signal of the synthesis circuit is changed by changing at least one of the capacitance values of the first and second capacitors.

22. The DLL circuit according to claim 21, wherein the duty detection circuit includes:
a first discharging element that discharges a first node which is connected to the first capacitor and has been reset to a prescribe voltage, corresponding to the activation period of the in-phase signal;
a second discharging element that discharges a second node which is connected to the second capacitor and has been reset to the prescribe voltage, corresponding to the activation period of the reverse-phase signal; and
a voltage comparator comparing a voltage of the first node and a voltage of the second node, a result of the duty detection being obtained based on the result of the comparison by the voltage comparator.

23. The DLL circuit according to claim 21, wherein each of the first capacitor and the second capacitor includes a plurality of MOS capacitors.

24. The DLL circuit according to claim 23, wherein the plurality of MOS capacitors have different sizes each other.

25. The DLL circuit according to claim 24, wherein the duty detection circuit includes:
a first charging element that charges the first node corresponding to a non-activation period of the in-phase signal; and
a second charging element that charges the second node corresponding to a non activation period of the reverse-phase signal.

26. The DLL circuit according to claim 24, the duty detection circuit includes
a preset circuit that sets the first and second nodes to the same prescribed voltage in response to a control signal supplied thereto.

27. A semiconductor device comprising:
a memory cell array;
a memory control circuit having an access circuit that accesses the memory cell array; and
a DLL circuit that generates a timing clock for an input and/or an output of memory cell data by the memory control circuit; wherein
the DLL circuit is that according to claim 20.

* * * * *

UNITED STATES PATENT AND TRADEMARK OFFICE
CERTIFICATE OF CORRECTION

| | | |
|---|---|---|
| PATENT NO. | : 7,932,759 B2 | Page 1 of 1 |
| APPLICATION NO. | : 12/554321 | |
| DATED | : April 26, 2011 | |
| INVENTOR(S) | : Abe et al. | |

It is certified that error appears in the above-identified patent and that said Letters Patent is hereby corrected as shown below:

In the claims:

Col 32

At claim number 25, line number 44, please replace "claim 24" with --claim 22--

At claim number 26, line number 52, please replace "claim 24" with --claim 22--

Signed and Sealed this
Sixteenth Day of August, 2011

David J. Kappos
*Director of the United States Patent and Trademark Office*